United States Patent
Suzuki et al.

(10) Patent No.: US 9,978,675 B2
(45) Date of Patent: May 22, 2018

(54) PACKAGE, ELECTRONIC COMPONENT, AND ELECTRONIC APPARATUS

(71) Applicant: CANON KABUSHIKI KAISHA, Tokyo (JP)

(72) Inventors: Takanori Suzuki, Tokyo (JP); Fujio Ito, Yokohama (JP); Tadashi Kosaka, Atsugi (JP); Takao Toyooka, Atsugi (JP); Koji Tsuduki, Kawasaki (JP); Yasushi Kurihara, Kawasaki (JP); Ikuto Kimura, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days. days.

(21) Appl. No.: 15/350,664

(22) Filed: Nov. 14, 2016

(65) Prior Publication Data

US 2017/0150601 A1   May 25, 2017

(30) Foreign Application Priority Data

Nov. 20, 2015   (JP) .................................. 2015-228090
Nov. 20, 2015   (JP) .................................. 2015-228091

(51) Int. Cl.
  *H01L 23/498*   (2006.01)
  *H01L 23/495*   (2006.01)
  (Continued)

(52) U.S. Cl.
  CPC .... *H01L 23/49861* (2013.01); *H01L 21/4842* (2013.01); *H01L 23/055* (2013.01);
  (Continued)

(58) Field of Classification Search
  CPC .................. H01L 23/49861; H01L 23/055
  See application file for complete search history.

(56) References Cited

U.S. PATENT DOCUMENTS

| 4,523,807 A | 6/1985 | Suzuki |
| 5,694,330 A | 12/1997 | Iwamura et al. |
| (Continued) | | |

FOREIGN PATENT DOCUMENTS

| JP | H10-308477 A | 11/1998 |
| JP | 2001-135752 A | 5/2001 |
| (Continued) | | |

OTHER PUBLICATIONS

Machine language translation of JP 2006-032703.*

*Primary Examiner* — Erik Kielin
(74) *Attorney, Agent, or Firm* — Fitzpatrick, Cella, Harper & Scinto

(57) ABSTRACT

A package includes an insulating member, first electrically conductive members, and a second electrically conductive member. Each of the first electrically conductive members includes a first terminal portion that forms a part of a first surface, and a second terminal portion that is positioned on a side of a side surface with respect to the first terminal portion and forms a part of the side surface. The second electrically conductive member includes an embedded portion embedded in the insulating member, third terminal portions each of which forms a part of the first surface and is connected to the embedded portion, and a fourth terminal portion that forms a part of a second surface and is connected to the embedded portion.

20 Claims, 12 Drawing Sheets

(51) Int. Cl.
  *H01L 23/055* (2006.01)
  *H01L 23/057* (2006.01)
  *H01L 23/50* (2006.01)
  *H01L 21/48* (2006.01)

(52) U.S. Cl.
  CPC ...... *H01L 23/057* (2013.01); *H01L 23/49503* (2013.01); *H01L 23/49541* (2013.01); *H01L 23/49551* (2013.01); *H01L 23/49555* (2013.01); *H01L 23/49805* (2013.01); *H01L 23/50* (2013.01); *H01L 2224/48247* (2013.01); *H01L 2224/78301* (2013.01); *H01L 2224/85181* (2013.01)

(56) References Cited

U.S. PATENT DOCUMENTS

| | | | |
|---|---|---|---|
| 5,986,334 | A | 11/1999 | Lee |
| 6,268,648 | B1 | 7/2001 | Fukutomi et al. |
| 6,321,182 | B1 | 11/2001 | Suzuki |
| 7,102,209 | B1 * | 9/2006 | Bayan ................ H01L 23/3107 257/666 |
| 7,608,914 | B1 * | 10/2009 | Spurlock ........... H01L 23/49861 257/666 |
| 7,731,904 | B2 | 6/2010 | Okamoto et al. |
| 9,087,850 | B2 | 7/2015 | Fujisawa et al. |
| 9,248,445 | B2 | 2/2016 | Okamoto et al. |
| 9,263,274 | B2 | 2/2016 | Fujisawa et al. |
| 2003/0127711 | A1 * | 7/2003 | Kawai ................ H01L 21/4842 257/666 |
| 2004/0070056 | A1 | 4/2004 | Matsuzawa et al. |
| 2009/0096041 | A1 * | 4/2009 | Sakakibara ............. B81B 7/007 257/419 |
| 2010/0327428 | A1 * | 12/2010 | Ono ...................... H01L 23/055 257/692 |
| 2011/0089544 | A1 | 4/2011 | Ono |
| 2012/0108013 | A1 | 5/2012 | Fujisawa et al. |
| 2015/0061094 | A1 * | 3/2015 | Fan ...................... H01L 23/047 257/670 |
| 2015/0279770 | A1 | 10/2015 | Kataoka et al. |
| 2015/0294870 | A1 | 10/2015 | Fujisawa et al. |
| 2016/0119564 | A1 | 4/2016 | Suzuki et al. |

FOREIGN PATENT DOCUMENTS

| | | | |
|---|---|---|---|
| JP | 2004-071801 | A | 3/2004 |
| JP | 2005-005353 | A | 1/2005 |
| JP | 2005-235885 | A | 9/2005 |
| JP | 2006-032703 | * | 2/2006 |
| JP | 2009-016572 | A | 1/2009 |
| JP | 2012-059782 | A | 3/2012 |
| JP | 2013-143445 | A | 7/2013 |
| JP | 5574667 | B | 8/2014 |
| JP | 5689514 | B | 3/2015 |

* cited by examiner

E-E'

F-F'

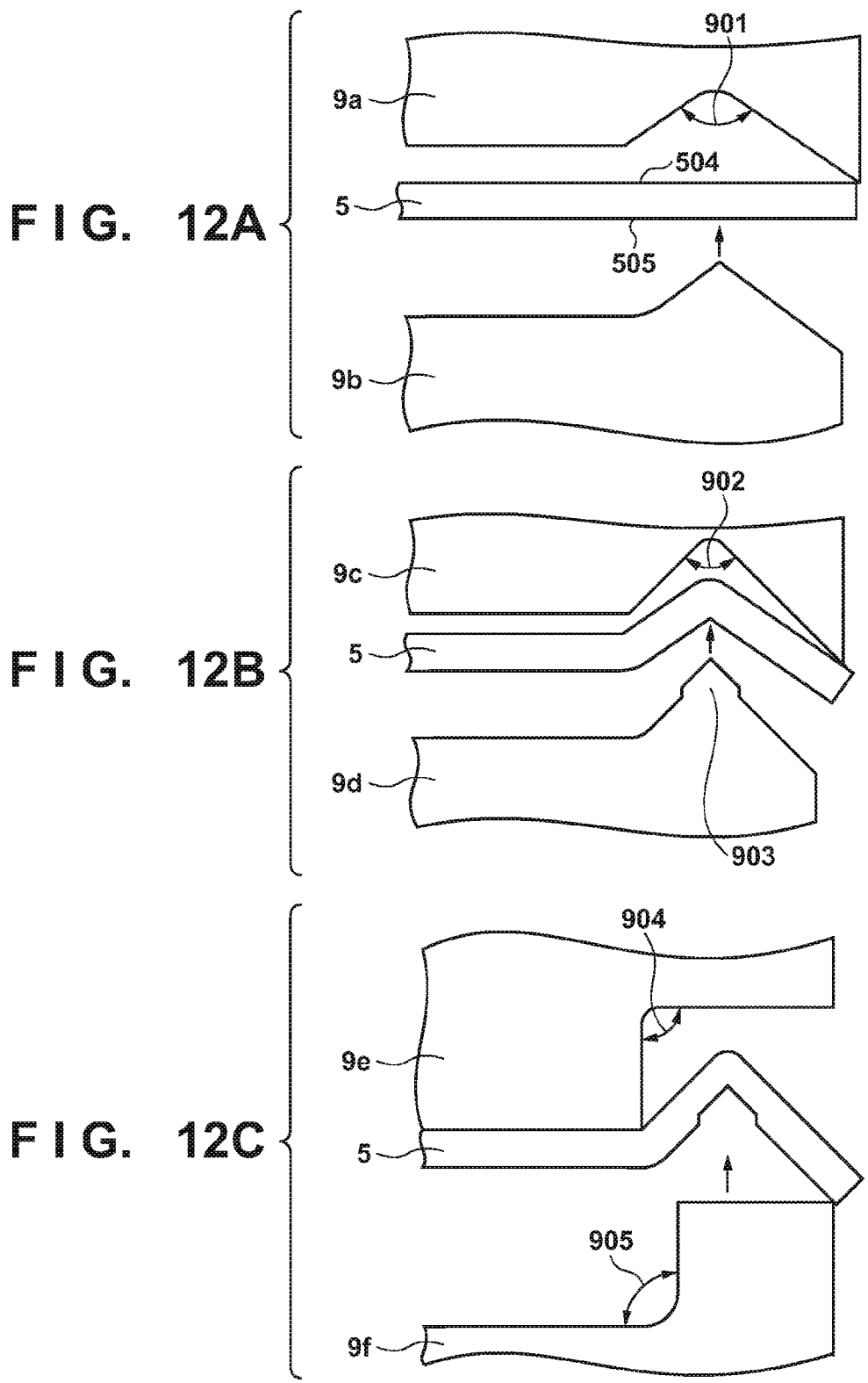

PACKAGE, ELECTRONIC COMPONENT, AND ELECTRONIC APPARATUS

BACKGROUND OF THE INVENTION

Field of the Invention

The present invention relates to a package, an electronic component, and an electronic apparatus.

Description of the Related Art

Various kinds of packages have been proposed in order to mount an electronic device. Japanese Patent Laid-Open No. 2005-005353 proposes a QFN (Quad Flat Non Leaded Package) package formed by molding a lead frame with a resin. The size of this package is made smaller than that of a package with a gull-wing lead by exposing, on the rear surface of the package, a portion of a lead connected to a mounting board.

SUMMARY OF THE INVENTION

In accordance with, for example, an improvement in functionality of an electronic device, the number of electrodes included in the electronic device is increasing. In a package of Japanese Patent Laid-Open No. 2005-005353, the number of leads needs to be increased along with an increase in the electrodes of the electronic device. However, the size of the package needs to be increased in order to increase the number of leads while maintaining a spacing between the leads needed for soldering to mount the package on a mounting board. An aspect of the present invention provides a technique advantageous in coping with the increase in the electrodes of the electronic device while suppressing an increase in a package size.

According to some embodiments, a package including a first surface on which an electronic device is to be mounted, a second surface on a side opposite to the first surface, and a side surface that connects the first surface and the second surface is provided. The package comprises: an insulating member that forms a part of the first surface, a part of the second surface and a part of the side face; a plurality of first electrically conductive members; and a second electrically conductive member. Each of the plurality of first electrically conductive members includes a first terminal portion that forms a part of the first surface, and a second terminal portion that is positioned on a side of the side surface with respect to the first terminal portion and forms a part of the side surface. The second electrically conductive member includes an embedded portion embedded in the insulating member, a plurality of third terminal portions each of which forms a part of the first surface and is connected to the embedded portion, and a fourth terminal portion that forms a part of the second surface and is connected to the embedded portion.

Further features of the present invention will become apparent from the following description of exemplary embodiments (with reference to the attached drawings).

BRIEF DESCRIPTION OF THE DRAWINGS

FIGS. 12A to 12C are views for explaining a method of manufacturing the package in FIGS. 11A to 11D.

DESCRIPTION OF THE EMBODIMENTS

Figure 1A:
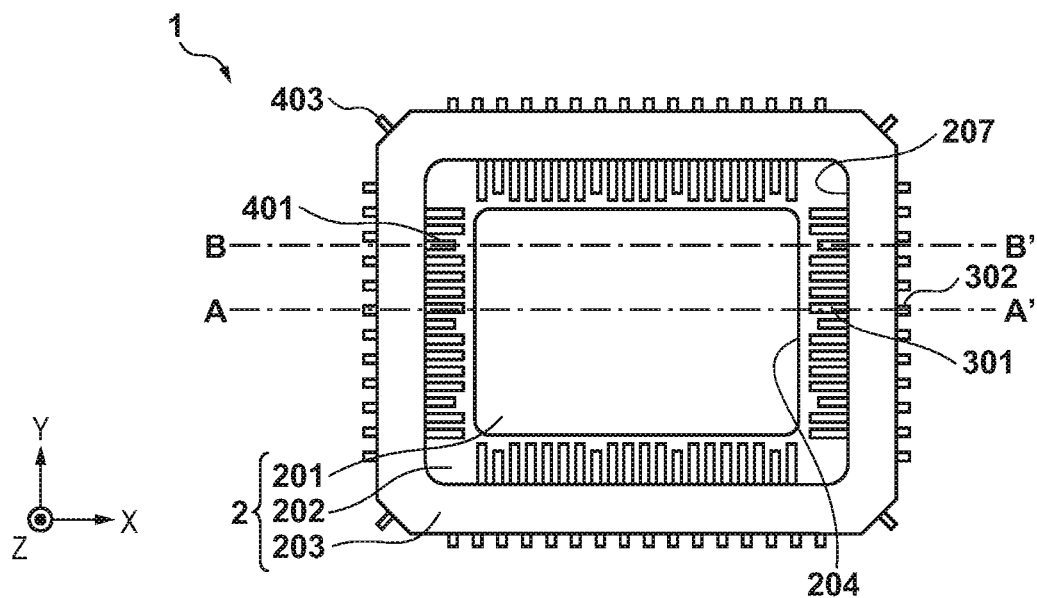
FIGS. 1A to 1D are schematic views for explaining a package according to some embodiments.

Embodiments of the present invention will be described with reference to the accompanying drawings. In a description and the drawings below, common reference numerals denote common arrangements throughout the plurality of drawings. Therefore, the common arrangements will be described with reference to the plurality of drawings mutually, and descriptions of the arrangements denoted by the common reference numerals will be omitted as needed. In a coordinate system shown in each view, the X direction indicates the longitudinal direction of a package, the Y direction indicates the widthwise direction of the package, and the Z direction indicates the thickness direction of the package. The package of each embodiment to be described below has a rectangular shape in an X-Y plane. However, the present invention can also be applied to a package having a circle or another shape.

First Embodiment

Figure 1B:
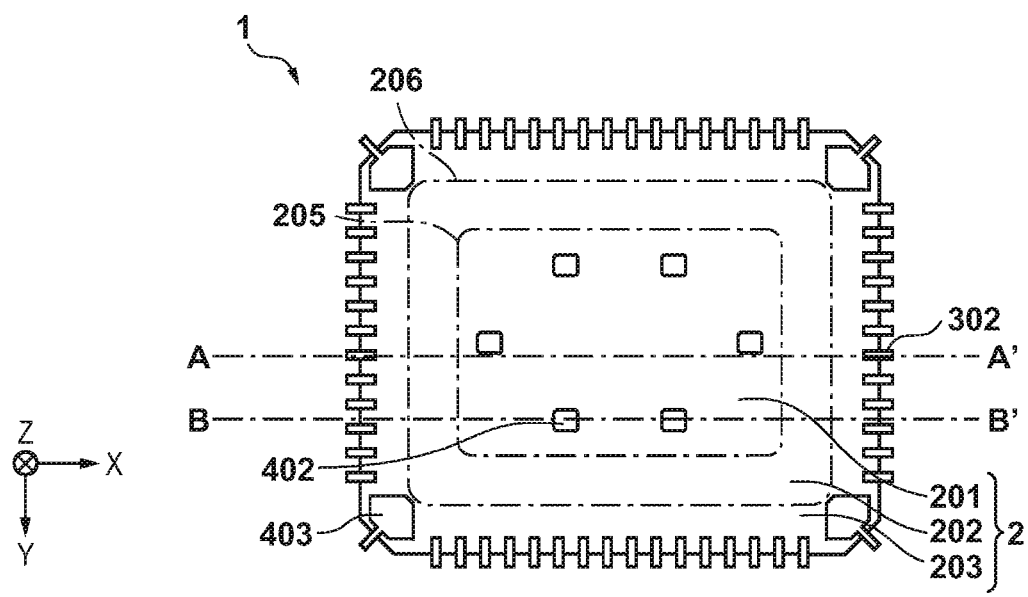
Figure 1C:
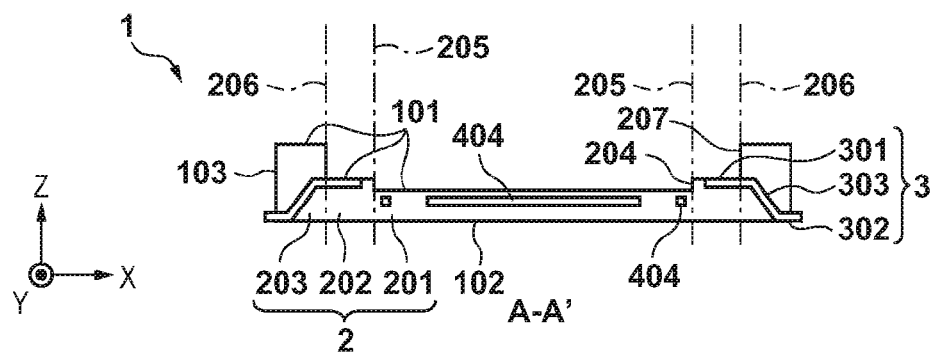
Figure 1D:
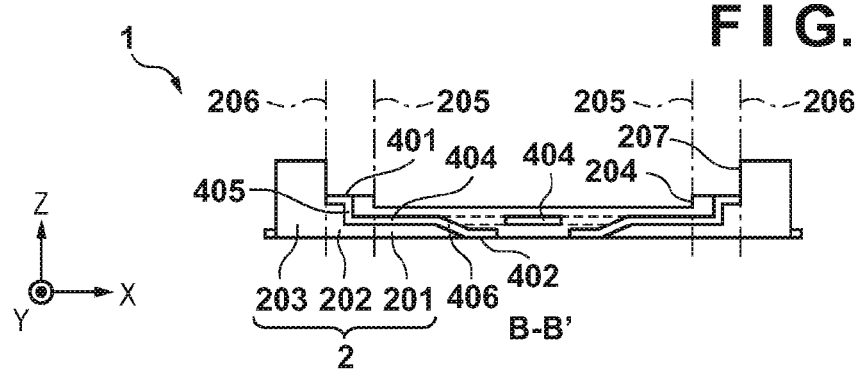
Figure 2:
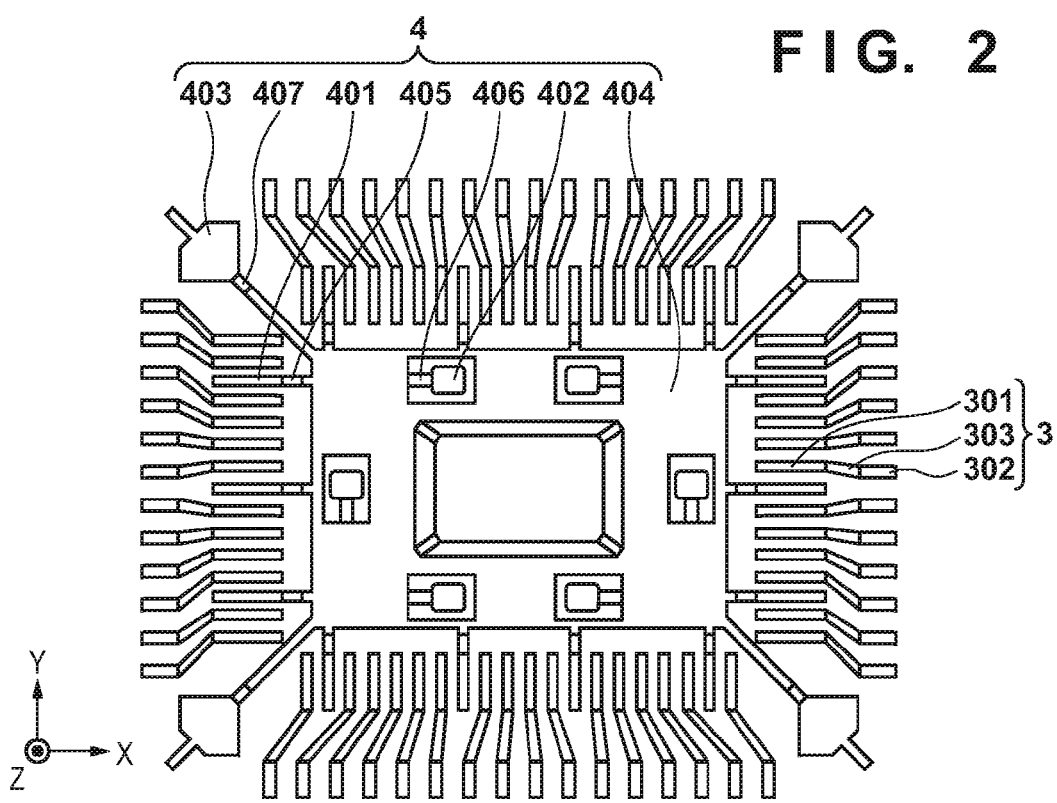
FIG. 2 is a view for explaining a part of the package in FIGS. 1A to 1D.

A package 1 for mounting an electronic device will be described as the first embodiment of the present invention with reference to FIGS. 1A to 1D and FIG. 2. Of the package 1, a side on which the electronic device is mounted will be referred to as an upper side, and a side opposite to that side will be referred to as a lower side. The lower side of the package 1 faces a mounting board when the package 1 is mounted on the mounting board. A surface on the upper side of the package 1 (a surface shown in FIG. 1A) will be referred to as an upper surface 101. A surface on the lower side of the package 1 (a surface shown in FIG. 1B) will be referred to as a bottom surface 102. Further, a surface which connects the upper surface and the bottom surface of the package 1 will be referred to as side surfaces 103. Each of the surfaces 101 to 103 of package 1 may be flat and have unevenness, a step, a curved surface, a projection, or the like. FIG. 1A is a schematic plan view showing the package 1 as viewed from the upper side. FIG. 1B is a schematic bottom view showing the package 1 as viewed from the lower side. FIGS. 1C and 1D are schematic sectional views taken along a line A-A' and a line B-B' in each of FIGS. 1A and 1B. In FIG. 2, an insulating member 2 is removed from the schematic plan view of the package 1 shown in FIG. 1A, and attention is only paid to leads 3 and an electrically conductive member 4. FIG. 2 shows connecting portions 405 to be visible for a descriptive purpose. In practice, however, the connecting portions 405 overlap inner terminal portions 401.

The package 1 is mainly formed by one insulating member 2, the plurality of leads 3, and one electrically conductive member 4. Each lead 3 is also a kind of electrically conductive member. However, it will be referred to as the lead 3 hereinafter in order to avoid descriptive confusion with the electrically conductive member 4. The plurality of leads 3 and the electrically conductive member 4 are attached to the insulating member 2. In a description below, a reference is made to the package 1 by dividing it into three regions in a planar view. The planar view of the package 1 is obtained as viewed from the upper side of the package as in, for example, FIG. 1A. The same also applies to a planar view of another member. First, the region of the package 1 where the electronic device is mounted will be referred to as the first region. Next, the region of the package 1 where a part of each lead 3 (inner terminal portion 301) and parts of the electrically conductive member 4 (inner terminal portions 401) are exposed on the upper side will be referred to as the second region. The second region is in the outside of the first region in the planar view of the package 1. Then, a portion of the package 1 which forms the side surfaces 103 will be referred to as the third region. The third region is in the outside of the second region in the planar view of the package 1. In FIGS. 1A to 1D, broken lines 205 indicate the boundary between the first region and the second region, and broken lines 206 indicate the boundary between the second region and the third region. However, these boundary positions are not limited to these. Respective constituent elements of the package 1 will be described below.

First, the insulating member 2 will be described. The insulating member 2 can contain, as a material, a resin which is generally used in a package used for the electronic device. A thermosetting resin such as an epoxy resin or a phenol resin, or a thermoplastic resin such as a polyphenylene sulfide resin can be given as such a resin. The surface of the insulating member 2 on the upper side of the package 1 (the surface shown in FIG. 1A) will be referred to as the upper surface of the insulating member 2. The surface of the insulating member 2 on the lower side of the package 1 (the surface shown in FIG. 1B) will be referred to as the bottom surface of the insulating member 2. Further, the surfaces which connect the upper surface and the bottom surface of the insulating member 2 will be referred to as the side surfaces. The upper surface, the bottom surface, and the side surfaces of the insulating member 2 form a part of the upper surface 101, a part of the bottom surface 102, and a part of each side surface 103 of the package 1, respectively. The upper surface and the bottom surface of the insulating member 2 are substantially parallel to each other. In this specification, the fact that two elements are substantially parallel to each other means that an angle formed by these elements falls within a range of 0° (inclusive) to 10° (inclusive). Further, the fact that two elements form an substantially right angle, or they are substantially perpendicular to each other means that an angle formed by these elements falls within a range of 80° (inclusive) to 100° (inclusive). The angle formed by two elements refers to an angle of a portion falling within a range of 0° (inclusive) to 180° (inclusive) out of the angles formed by two elements. Of the insulating member 2, portions in the first region, the second region, and the third region will be referred to an inner portion 201, an intermediate portion 202, and an outer portion 203, respectively. The inner portion 201 includes a portion for supporting the electronic device. The outer portion 203 forms the side surfaces of the insulating member 2. The intermediate portion 202 is positioned between the inner portion 201 and the outer portion 203.

As shown in FIGS. 1C and 1D, the height of the upper surface of the intermediate portion 202 is higher than that of the inner portion 201, and the height of the upper surface of the outer portion 203 is higher than that of the intermediate portion 202. In this specification, the height of each element of the package 1 is measured in the Z direction with reference to the bottom surface of the package 1. Because of the differences between the heights of the upper surface of the insulating member 2, on the upper surface of the insulating member 2, a step 204 is formed at the boundary between the inner portion 201 and the intermediate portion 202, and a step 207 is formed at the boundary between the intermediate portion 202 and the outer portion 203. This step 207 forms a cavity structure on the upper surface of the insulating member 2. The electronic device such as an image capturing device or the like is accommodated in this cavity structure. A hollow structure is formed by pasting a cover member on the upper surface of the insulating member 2. The thickness of the inner portion 201 is, for example, about 0.9 mm. The thickness of the intermediate portion 202 is, for example, about 1.0 mm. The thickness of the outer portion 203 is, for example, about 1.3 mm. The area of the upper surface of the inner portion 201 is, for example, about 30 mm×23 mm. These sizes change depending on the size or the number of electrodes of the mounted electronic device. The bottom surface of the insulating member 2 is flat.

Then, the leads 3 will be described. The plurality of leads 3 are attached to the insulating member 2. In FIGS. 1A to 1D and 2, reference numerals are only given to one lead 3. As shown in FIG. 2, however, the package 1 includes sixteen leads 3 each above and below in the X direction as the longitudinal direction and twelve leads 3 each in the Y direction as the widthwise direction, making a total of fifty-six leads 3. In this embodiment, the plurality of leads 3 are arranged with being separated into four sides of the package 1. With this arrangement, it is possible to increase the number of leads of the package 1. Instead of this, the leads 3 may be arranged only on two sides or three sides of the package 1. With this arrangement, it is possible to reduce the size of the package 1 on the sides without the leads 3.

Each lead 3 includes the inner terminal portion 301, an outer terminal portion 302, and a connecting portion 303. The inner terminal portion 301 of each lead 3 is a portion which forms a part of the upper surface 101 of the package 1 and is substantially parallel to the upper surface of the insulating member 2. The upper surface of the inner terminal portion 301 of each lead 3 is exposed from the upper surface in the intermediate portion 202 of the insulating member 2. Each inner terminal portion 301 is a portion where at least one of electrical connection or mechanical connection with another member is obtained. The same also applies to another terminal portion to be described below. In this embodiment, the inner terminal portions 301 are used for electrical connection with the electronic device mounted on the package 1 (that is, inside the package 1). The outer terminal portion 302 of each lead 3 is a portion which forms a part of the side surface 103 of the package 1 and is exposed from at least the side surface of the insulating member 2. In this embodiment, the outer terminal portion 302 of each lead 3 also forms a part of the bottom surface 102 of the package 1. Further, the outer terminal portion 302 of each lead 3 is positioned on the side of the side surface 103 of the package 1 with respect to the inner terminal portion 301, and is exposed from both the side surface and the bottom surface of the insulating member 2. The outer terminal portions 302 are used for electrical connection with the mounting board to which electronic components made by the electronic device and the package 1 are attached (that is, outside the package 1). Therefore, gold plating or the like may be performed on the outer terminal portions 302 in order to obtain solder wettability. When each lead 3 is formed by a copper material, Ni plating may also be performed as the underlying layer for the gold plating. Each connecting portion 303 is a portion which connects the outer terminal portion 302 and the end of the inner terminal portion 301 farther from the center of the insulating member 2 (that is, the end on the side of the side surface 103 of the package 1), and is embedded in the insulating member 2. In this specification, the fact that "the first element is embedded in the second element" means that the first element is surrounded by the second element in a certain cross-section surface. Each lead 3 is formed in a direction outside the inner terminal portion 301, and embedded in the insulating member 2 at the boundary (broken lines 206) between the second region and the third region. Each outer terminal portion 302 is exposed from the insulating member 2 in the third region. The connecting portions 303 extend in a direction crossing the bottom surface of the insulating member 2. The package 1 is of a QFN type, and each lead 3 bends in two portions such that the corresponding inner terminal portion 301 becomes higher than the corresponding outer terminal portion 302. The spacing (distance) between the inner terminal portions 301 of two adjacent leads 3 is narrower than the spacing (distance) between the outer terminal portions 302 of two adjacent leads 3.

Then, the electrically conductive member 4 will be described. The electrically conductive member 4 includes an embedded portion 404, the inner terminal portions 401, the connecting portions 405, outer terminal portions 402, connecting portions 406, outer terminal portions 403, and connecting portions 407. In this embodiment, the package 1 includes only one electrically conductive member 4.

The embedded portion 404 is a portion to which the inner terminal portions 401, the outer terminal portions 402, and the outer terminal portions 403 are connected in common via the connecting portions 405, the connecting portions 406, and the connecting portions 407, respectively. The embedded portion 404 is substantially parallel to the bottom surface of the insulating member 2 and extends along this bottom surface. The embedded portion 404 is positioned in the first region of the package 1 and occupies most of the first region. The embedded portion 404 having such a large plate-like shape can be referred to as an island portion. Instead of this, the embedded portion 404 may only have a size large enough to be connected by the inner terminal portions 401, the outer terminal portions 402, and the outer terminal portions 403 in common. Further, the embedded portion 404 may have a rectangular shape or another shape such as a linear shape. When the package 1 includes two or more electrically conductive members 4, each electrically conductive member 4 includes the embedded portion 404. In a package capable of forming a hollow structure which places great importance on airtightness like the package 1, moisture resistance of the package 1 can be improved by increasing the size of the embedded portion 404. The embedded portion 404 of the package 1 is embedded in the insulating member 2. A part of the upper surface of the embedded portion 404 may be exposed from the upper surface of the insulating member 2, or the entire upper surface of the embedded portion 404 may be covered with the insulating member 2. The bending amount of each connecting portion 406 which connects the embedded portion 404 of the package 1 and the corresponding outer terminal portion 402 can be decreased as the embedded portion 404 is positioned closer to the bottom surface of the insulating member 2. In this case, the outer terminal portion 402 is formed more easily. The same also applies to formation of the outer terminal portions 403.

Each inner terminal portion 401 of the electrically conductive member 4 is a portion which forms a part of the upper surface 101 of the package 1 and is substantially parallel to the upper surface of the insulating member 2. The upper surface of each inner terminal portion 401 of the electrically conductive member 4 is exposed from the upper surface of the insulating member 2 in the intermediate portion 202. The embedded portion 404 is positioned on the side opposite to each side surface 103 of the package 1 with respect to the inner terminal portions 401. The inner terminal portions 401 are used for the electrical connection with the electronic device mounted on the package 1 (that is, inside the package 1). In FIGS. 1A to 1D, each inner terminal portion 401 of the electrically conductive member 4 is shorter than the inner terminal portion 301 of each lead 3 so that they can be distinguished easily. However, they may have the same length, or each inner terminal portion 401 may be longer than the inner terminal portion 301.

In FIGS. 1A to 1D and 2, reference numeral is only given to one inner terminal portion 401. As shown in FIG. 2, however, the package 1 includes four inner terminal portions 401 each above and below in the X direction as the longitudinal direction and three inner terminal portions 401 each in the Y direction as the widthwise direction, making a total of fourteen inner terminal portions 401. In general, the plurality of inner terminal portions 401 are connected in common to one embedded portion 404. Since the plurality of inner terminal portions 401 are electrically connected to each other, a common potential is applied to them from the mounting board. In general, the electronic device mounted on the package includes the plurality of electrodes for supplying the same potential like a ground potential. The package 1 of this embodiment uses the electrically conductive member 4 which includes the plurality of inner terminal portions 401 electrically connected to each other in order to connect to the plurality of electrodes for supplying the same potential, thereby decreasing the number of leads 3 of the package 1 used for connection with the mounting board.

In general, the spacing (for example, about 0.4 mm) between the electrodes needed to bonding-connect the electronic device to the package is smaller than the spacing (for example, 0.6 to 1.0 mm) between the leads needed to solder the package to the mounting board. It is therefore possible, on each side of the package 1, to line up the inner terminal portions 401 of the electrically conductive member 4 and the inner terminal portions 301 of the leads 3 along the side of the package 1 while maintaining the sufficient spacing needed for bounding. For example, if the number of inner terminal portions 401 of the electrically conductive member 4 (for example, fifty) is almost smaller than half the number (for example, one hundred) of inner terminal portions 301 of the leads 3, they can be lined up as described above. As a result, the size of the package 1 is reduced.

As in this embodiment, the inner terminal portions 301 of the leads 3 and the inner terminal portions 401 of the electrically conductive member 4 may be arranged so as to have nesting. In this arrangement, one inner terminal portion 401 is positioned between two inner terminal portions 301 in a direction in which the plurality of terminal portions including the plurality of inner terminal portions 301 and the plurality of inner terminal portions 401 are arrayed. With this arrangement, it is possible to shorten the distance between the inner terminal portion 301 and the outer terminal portion 302 of the lead 3 close to each corner of the package 1 in particular, and to decrease an angle at which each connecting portion 303 is stretched obliquely. This makes it possible to narrow the spacing between the leads 3 while avoiding interference between the adjacent leads 3.

The inner terminal portions 401 of the electrically conductive member 4 may be localized to one side of the package 1 or may be arranged with being separated into two or more sides (for example, all of four sides). Further, even on each side, the plurality of inner terminal portions 401 may be arranged separately. For example, the inner terminal portions 401 may be arranged with being separated into both sides with respect to the center of one side. With this arrangement, the package 1 can mount the electronic device in which the electrodes for supplying the ground potential or a power supply voltage are arranged separately.

Each connecting portion 405 is a portion which connects the embedded portion 404 and the end of the corresponding inner terminal portion 401 closer to the center of the insulating member 2 (that is, the end on the side opposite to the side surface 103 of the package 1). The connecting portions 405 are embedded in the insulating member 2. The electrically conductive member 4 bends in each connecting portion 405 such that the corresponding inner terminal portion 401 becomes higher than the embedded portion 404. The connecting portions 405 extend in the direction crossing the bottom surface of the insulating member 2. In this embodiment, the connecting portions 405 extend in a direction substantially perpendicular to the bottom surface of the insulating member 2.

In this embodiment, an angle 416 formed by the inner terminal portion 401 and the connecting portion 405 of the electrically conductive member 4 is smaller than an angle 315 formed by the inner terminal portion 301 and the connecting portion 303 of the lead 3. The angle 416 formed by the inner terminal portion 401 and the connecting portion 405 of the electrically conductive member 4 refers to as an angle which is, for example, perpendicular to the inner terminal portion 401 and viewed from a direction parallel to the bottom surface of the insulating member 2. Similarly, the angle 315 formed by the inner terminal portion 301 and the connecting portion 303 of the lead 3 refers to as an angle which is, for example, perpendicular to the inner terminal portion 401 and viewed from the direction parallel to the bottom surface of the insulating member 2. The angle 416 formed by the inner terminal portion 401 and the connecting portion 405 of the electrically conductive member 4 is substantially equal to an angle 417 formed by the embedded portion 404 and the connecting portion 405 of the electrically conductive member 4. Also, the angle 315 formed by the inner terminal portion 301 and the connecting portion 303 of the lead 3 is substantially equal to an angle 316 formed by the outer terminal portion 302 and the connecting portion 303 of the lead 3. Since the spacing between the outer terminal portions 302 of two adjacent leads 3 is larger than the spacing between these inner terminal portions 301, the leads 3 include portions bent in the planar view. It is therefore possible to suppress a bend or a deformation in each lead 3 as the angle 315 formed by the inner terminal portion 301 and the connecting portion 303 of the lead 3 is larger to the extent that it has no influence on downsizing of the package 1. On the other hand, it is possible to extend the inner terminal portion 401 of the electrically conductive member 4 on a straight line from the embedded portion 404 in the planar view. Therefore, a risk of deforming the inner terminal portion 401 is low even if the angle 416 formed by the inner terminal portion 401 and the connecting portion 405 of the electrically conductive member 4 becomes smaller. Accordingly, the angle 416 formed by the inner terminal portion 401 and the connecting portion 405 of the electrically conductive member 4 falls within a range of, for example, 30° (inclusive) to 100° (inclusive), and the angle 315 formed by the inner terminal portion 301 and the connecting portion 303 of the lead 3 falls within a range of, for example, 110° (inclusive) to 140° (inclusive).

Each outer terminal portion 402 of the electrically conductive member 4 is a portion which forms a part of the bottom surface 102 of the package 1 and is substantially parallel to the bottom surface of the insulating member 2. In this embodiment, the outer terminal portions 402 of the electrically conductive member 4 are exposed from the bottom surface of the insulating member 2 in the inner portion 201. The outer terminal portions 402 are used for the electrical connection with the mounting board (outside the package 1). Therefore, gold plating or the like may be performed on the outer terminal portions 402 in order to obtain solder wettability. When the electrically conductive member 4 is formed by a copper material, Ni plating may also be performed as the underlying layer for the gold plating. The outer terminal portions 402 of the electrically conductive member 4 are positioned immediately below the electronic device when this electronic device is mounted on the package 1. Therefore, the effect of dissipating heat from the electronic device by each outer terminal portion 402 of the electrically conductive member 4 is higher than a heat dissipation effect of each lead 3 positioned in the circumference of the package 1. In this embodiment, the electrically conductive member 4 includes six outer terminal portions 402. However, the present invention is not limited to this, and the electrically conductive member 4 suffices to include one or more outer terminal portions 402. In general, the number of inner terminal portions 401 of the electrically conductive member 4 is larger than that of outer terminal portions 402 of the electrically conductive member 4. Each outer terminal portion 402 is positioned closer to the boundary (broken lines 205) between the inner portion 201 and the intermediate portion 202 than the center of the inner portion 201 of the insulating member 2. The electrical characteristic of the electronic device is improved by arranging each outer terminal portion 402 of the insulating member 2 close to the inner terminal portion 301 of the lead 3 as described above. From the viewpoint of a heat dissipation property, the plurality of outer terminal portions 402 may be arranged separately on the bottom surface of the insulating member 2. For example, the plurality of outer terminal portions 402 may be arranged with being separated into four regions divided by two diagonal lines on the bottom surface of the insulating member 2.

Each connecting portion 406 is a portion which connects the outer terminal portion 402 and the embedded portion 404. The connecting portions 406 are embedded in the insulating member 2. The electrically conductive member 4 bends in each connecting portion 406 such that the corresponding outer terminal portion 402 is exposed from the bottom surface of the insulating member 2. The connecting portions 406 extend in the direction crossing the bottom surface of the insulating member 2. An angle 418 formed by the outer terminal portion 402 and the connecting portion 406 of the electrically conductive member 4 has a small influence on the size of the package 1. Therefore, the angle 418 formed by the outer terminal portion 402 and the connecting portion 406 of the electrically conductive member 4 may be smaller than the angle 416 formed by the inner terminal portion 401 and the connecting portion 405 of the electrically conductive member 4. The angle 418 formed by the outer terminal portion 402 and the connecting portion 406 of the electrically conductive member 4 is substantially equal to an angle 419 formed by the embedded portion 404 and the connecting portion 406 of the electrically conductive member 4.

Each outer terminal portion 403 is a portion which forms a part of the side surface 103 of the package 1. In this embodiment, each outer terminal portion 403 of the electrically conductive member 4 also forms a part of the bottom surface 102 of the package 1. Each outer terminal portion 403 of the electrically conductive member 4 is exposed from both the side surface and the bottom surface of the insulating member 2. The outer terminal portions 402 are used for the electrical connection with the mounting board (outside the package 1). Therefore, gold plating or the like may be performed on the outer terminal portions 403 in order to obtain solder wettability. When each lead 3 is formed by the copper material, Ni plating may also be performed as the underlying layer for the gold plating. In this embodiment, the outer terminal portions 403 are arranged at four corners of the package 1. In this embodiment, the area of the exposed surface of one outer terminal portion 403 of the electrically conductive member 4 is larger than that of the outer terminal portion 302 of one lead 3. By arranging such an outer terminal portion 403, it is possible to arrange, with a good balance, a portion of the electrically conductive member 4 exposed on the bottom surface of the insulating member 2 on an electrical characteristic surface. When the package 1 is mounted on the mounting board, it becomes easier to endure stresses on four corners each caused by a linear expansion coefficient difference between the mounting board and the package 1, increasing the reliability with respect to a temperature change.

Each connecting portion 407 is a portion which connects the corresponding outer terminal portion 403 and the embedded portion 404. The connecting portions 407 are embedded in the insulating member 2. The electrically conductive member 4 bends in each connecting portion 407 such that the corresponding outer terminal portion 403 is exposed from the bottom surface of the insulating member 2. The connecting portions 407 extend in the direction crossing the bottom surface of the insulating member 2. A part of each connecting portion 407 may be exposed from the upper surface of the insulating member 2 in the intermediate portion 202. This exposed portion can be used for the electrical connection with the electronic device.

As described above, the package 1 of this embodiment can mount the electronic device including the electrodes larger than the leads 3 in number. That is, it is possible to cope with a multipin structure of the electronic device while suppressing an increase in the size of the package 1. Further, since some portions of the electrically conductive member 4 are connected to the mounting board immediately below the electronic device, the package 1 has the high heat dissipation property for heat generated by the electronic device.

Figure 3:
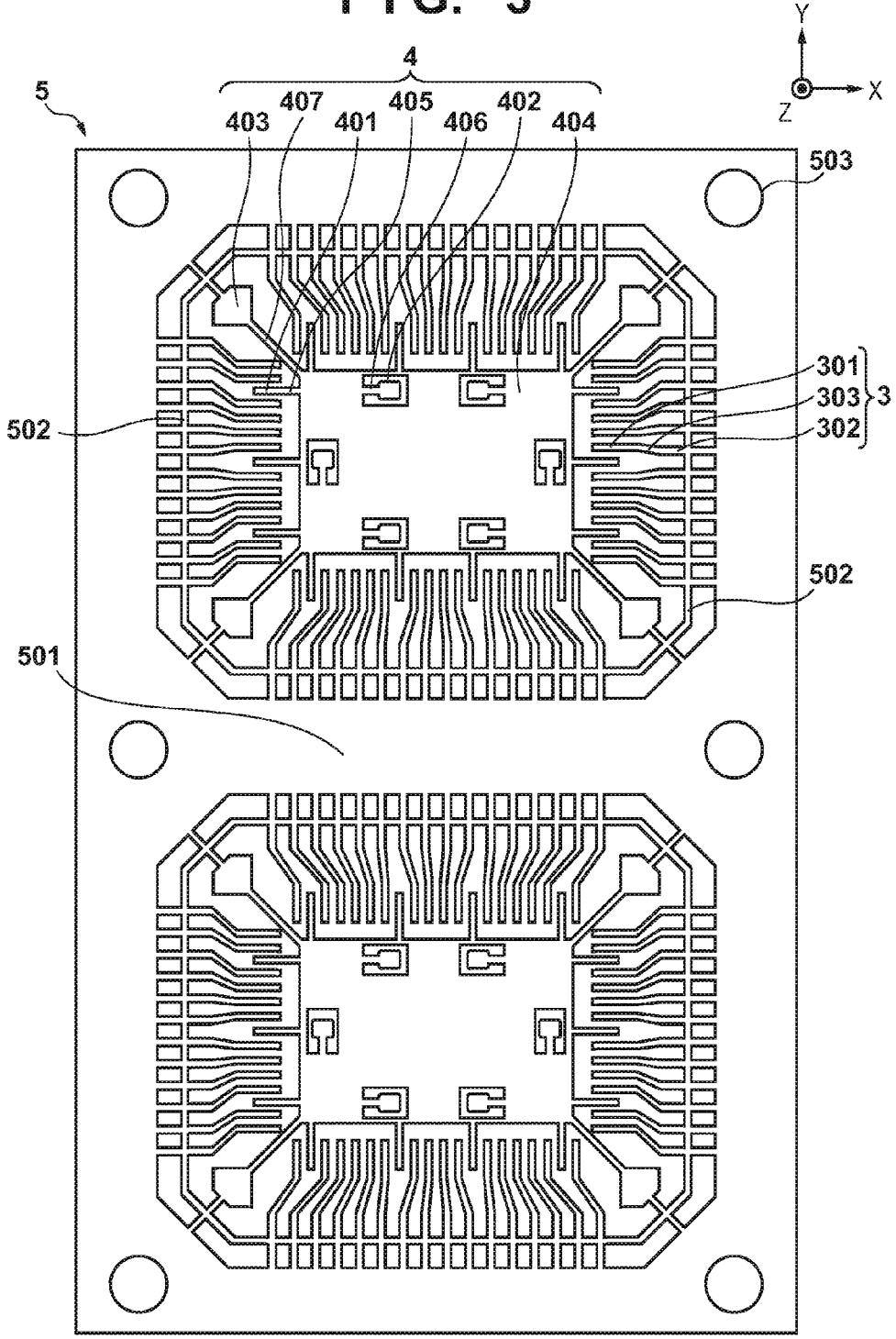
FIG. 3 is a schematic view for explaining a lead frame for forming the package in FIGS. 1A to 1D.

A method of manufacturing the package 1 in FIGS. 1A to 1D will now be described with reference to FIG. 3. The package 1 is manufactured by, for example, a molding method utilizing a lead frame. First, a lead frame 5 shown in FIG. 3 is prepared. Two packages 1 can be formed from the lead frame 5. In the lead frame 5, a frame portion 501 and tie bars 502 support a portion for forming the leads 3 and a portion for forming the electrically conductive member 4. That is, the frame portion 501 and the tie bars 502 function as support portions.

There is the embedded portion 404 inside the tie bars 502 each having a frame shape. The embedded portion 404 is connected to the tie bars 502 by the outer terminal portions 403 and the connecting portions 407. The plurality of leads 3 extend from the tie bars 502 to the embedded portion 404. Each tip portion having the tip of this extended portion serves as the inner terminal portion 301 of the lead 3. At least some of the leads 3 bend midway from the tie bars 502 to the tips. The inner terminal portions 401 and the connecting portions 405 extend on the straight line from the embedded portion 404 of the electrically conductive member 4 to the tie bars 502. Each tip portion including the tip of this extended portion serves as the inner terminal portion 401 of the electrically conductive member 4. The outer terminal portions 402 and the connecting portions 406 are formed inside the embedded portion 404.

The lead frame 5 is formed by performing an existing process such as a wet etching process or a punching process using a metal die on a metal plate formed by a material such as iron, a nickel alloy, copper, or a copper alloy. In order to improve the heat dissipation property of the electrically conductive member 4, a metal plate formed by a material such as copper or a copper alloy having a high thermal conductivity may be used. The thickness of the metal plate may be, for example, 0.1 to 0.3 mm in consideration of a punching property or a bending property. The thickness of the metal plate may also be, for example, 0.2 to 0.3 mm in consideration of thermal conduction.

If each outer terminal portion 402 of the electrically conductive member 4 is too small, an unsticking/failure in soldering is easily caused by a thermal deformation arising from solder reflow when the outer terminal portion 402 is attached to the mounting board. On the other hand, if each outer terminal portion 402 of the electrically conductive member 4 is too large, a void easily enters a solder joint surface, or the stress tends to concentrate on a joint portion. Accordingly, the width of each outer terminal portion 402 may fall within a range of, for example, 1 mm to 5 mm. The heat dissipation property and the electrical characteristic of the package 1 are improved by increasing the number of outer terminal portions 402 while maintaining this size.

As described above, the electrical characteristic of the electronic device is improved as the inner terminal portions 301 of the leads 3 and the outer terminal portions 402 of the electrically conductive member 4 are positioned closer to each other. Therefore, each connecting portion 406 is connected to the corresponding outer terminal portion 402 in a direction parallel to the side closest to the outer terminal portions 402 out of four sides which form the circumference of the embedded portion 404. With this arrangement, it is possible to reduce the amount separation of each outer terminal portion 402 of the electrically conductive member 4 from the inner terminal portions 301 of the leads 3 in a subsequent bending step.

The frame portion 501 and the tie bars 502 support the electrically conductive member 4 via the outer terminal portions 403 arranged at four corners of the embedded portion 404. Accordingly, a state in which the frame portion 501 and the tie bars 502 support not only the leads 3 but also the electrically conductive member 4 is also maintained in a subsequent resin forming step.

Then, the bending step is performed on the lead frame 5 such that the leads 3 and the electrically conductive member 4 are shaped to be used in the package 1. A method such as press working by the metal die can be used as this bending step. In the bending step, the inner terminal portions 301 of the leads 3 and the inner terminal portions 401 of the electrically conductive member 4 are bent on the upper surface side, and the outer terminal portions 302 of the leads 3 and the outer terminal portions 402 of the electrically conductive member 4 are bent on the bottom surface side.

After the bending step, the insulating member 2 is formed by performing a step of molding the resin on the lead frame 5. Resin molding by using the metal die such as transfer molding, injection molding or the like can be utilized as a molding step. First, hole portions 503 of the lead frame 5 are utilized to set the lead frame 5 in molded metal dies, and the tie bars 502 are sandwiched between the upper and lower molded metal dies, injecting a molded resin. A material for the molded resin includes a thermosetting resin, a thermoplastic resin, or the like. After the molded resin is cured, the package 1 is manufactured by performing a plating process such as gold plating on the leads 3 and the electrically conductive member 4, and disconnecting the tie bars 502. After the tie bars 502 are disconnected, each outer terminal portion 302 of the leads 3 protrudes from the side surface of the insulating member 2 by about 0.1 to 0.3 mm.

Figure 4A:
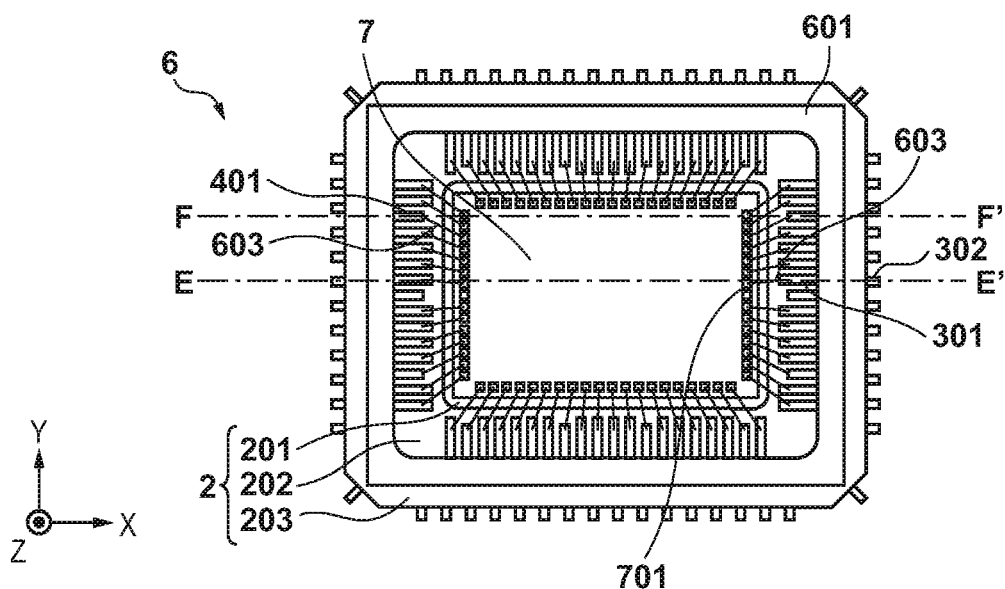
FIGS. 4A to 4C are schematic views for explaining an electronic component according to some embodiments.
Figure 4B:
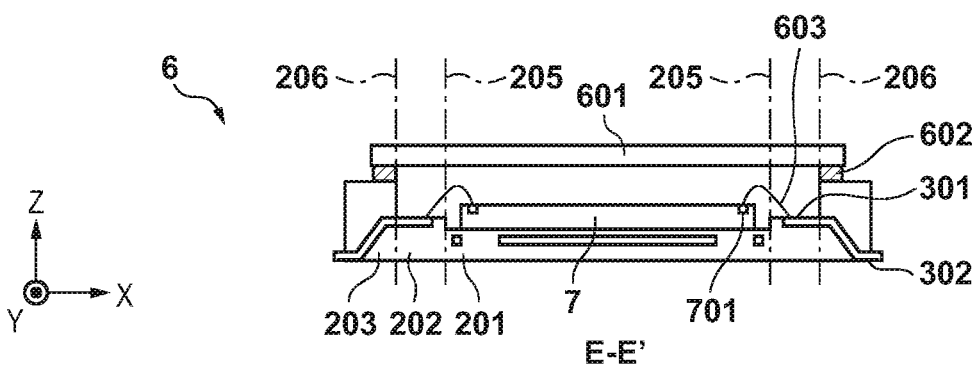
Figure 4C:
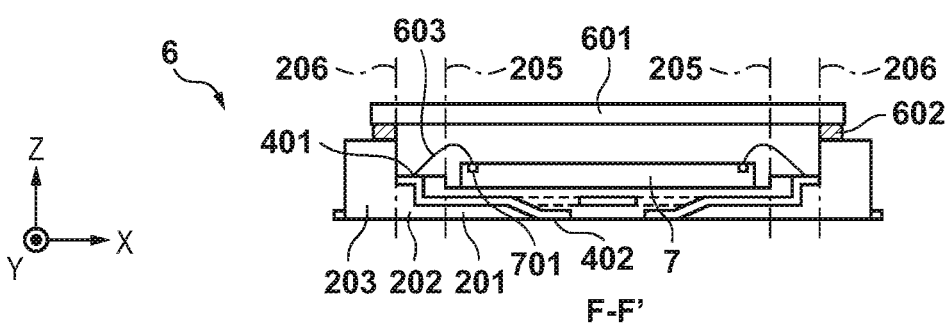

An electronic component 6 formed by mounting an electronic device 7 on the package 1 of FIGS. 1A to 1D will now be described with reference to FIGS. 4A to 4C. FIG. 4A is a schematic plan view showing the electronic component 6 as viewed from the upper side. FIGS. 4B and 4C, respectively, are schematic sectional views taken along a line E-E' and a line F-F' of FIG. 4A. A schematic bottom view showing the electronic component 6 as viewed from the lower side is the same as FIG. 1B, and thus it is omitted. The electronic component 6 mainly includes the package 1, the electronic device 7 mounted on the package 1, electrically conductive lines 603 which connect the electronic device 7 and the package 1, and a cover member 601 bonded to the package 1 above the electronic device 7.

The electronic device 7 includes a plurality of electrodes 701 for electrical connection with the package 1 along the sides of one surface. The electrodes 701 are, for example, pads. The electronic device 7 includes twenty electrodes 701 each above and below in the X direction as the longitudinal direction and fifteen electrodes 701 each in the Y direction as the widthwise direction, making a total of seventy electrodes 701. The electronic device 7 is, for example, an image capturing device (for example, a solid-state image sensor) such as a CCD image sensor or a CMOS image sensor used for a single-lens reflex digital camera, a compact camera, or the like. Another example of the electronic device 7 includes a display device using a liquid crystal element, an organic EL element, a MEMS (Micro Electro Mechanical Systems) element, or the like. When the electronic device 7 is the image capturing device, the electronic device 7 includes a pixel region including a plurality of photoelectric conversion elements. The size of the electronic device 7 is, for example, 5 mm×5 mm to 25 mm×18 mm.

Some of the electrodes 701 in the electronic device 7 are connected to the inner terminal portions 301 of the leads 3 by the electrically conductive lines 603, and some of the other electrodes 701 in the electronic device 7 are connected to the inner terminal portions 401 of the electrically conductive member 4 by the electrically conductive lines 603. The electrically conductive lines 603 are, for example, bonding wires formed by gold, copper, or aluminum. The number of electrodes 701 in the electronic device 7 is seventy in total, and the number obtained by summing the number of inner terminal portions 301 of the leads 3 and the number of inner terminal portions 401 of the electrically conductive member 4 in the package 1 is also seventy. Thus, they have one-to-one correspondence. Instead of this, the number obtained by summing the number of inner terminal portions 301 of the leads 3 and the number of inner terminal portions 401 of the electrically conductive member 4 in the package 1 may be larger or smaller than the number of electrodes 701 in the electronic device 7. As a result, configuration may be taken so that the electrically conductive lines 603 are not connected to some of the inner terminal portions 301 of the leads 3 and the inner terminal portions 401 of the electrically conductive member 4 in the package 1, or so that the electrically conductive lines 603 are not connected to some of the electrodes 701 in the electronic device 7.

Since the inner terminal portions 301 of the plurality of leads 3 are electrically separated from each other, the plurality of inner terminal portions 301 are connected to the electrodes for supplying individual signals out of the electrodes 701 in the electronic device 7. Each inner terminal portion 301 is connected to, for example, the electrode for supplying a signal which varies temporally. On the other hand, since the plurality of inner terminal portions 401 of the electrically conductive member 4 are electrically connected to each other, the plurality of inner terminal portions 401 are connected to the electrodes for supplying signals each having the same potential out of the electrodes 701 in the electronic device 7. As such an electrode, there is an electrode for supplying a power supply potential or an electrode for supplying a ground potential. In general, power supply potentials include different potentials such as a 3.3-V system, 5-V system, and the like. Therefore, the electrodes for supplying the ground potential (to be referred to as a ground electrode hereinafter) may be the largest in number. In a case in which, for example, the image capturing device includes 150 electrodes, there may be ten or more electrodes only for, for example, the ground electrodes dedicated to pixel portions each corresponding to a signal which supplies a driving waveform or a power supply voltage to the pixel portion. Only the ground electrodes for the pixel portion may be connected to the inner terminal portions 401 of the electrically conductive member 4. For example, both the ground electrode for A/D conversion and the ground electrode for the pixel portion may be connected to the inner terminal portions 401 of the electrically conductive member 4. This makes it possible to assign the inner terminal portions 301 of the leads 3 to electrodes for signal for reducing noise, achieving high functionality. When the image capturing device includes 150 electrodes, and fifty electrodes out of them are the ground electrodes, fifty, which is the same number as the number of ground electrodes, inner terminal portions 401 of the electrically conductive member 4 may be prepared in the package 1. The number of each of the outer terminal portions 402 and the outer terminal portions 403 of the electrically conductive member 4 may be smaller than the number of inner terminal portions 401 and, for example, about ten in total. Furthermore, the plurality of ground electrodes in the electronic device 7 may be connected separately to the inner terminal portions 401 of the electrically conductive member 4 and the inner terminal portions 301 of the leads 3. This makes it possible to further reduce noise generated in the electronic component 6.

The cover member 601 is fixed, by bonding members 602, to the upper surface of the outer portion 203 of the insulating member 2. As described above, the electronic device 7 has a hollow structure sealed with the package 1, the cover member 601, and the bonding members 602. The cover member 601 is formed by, for example, a light-transmissive member such as glass or a quartz plate. When copper is mainly used as the material for the leads 3 and the electrically conductive member 4, it is possible to match the linear expansion coefficient of a copper material with that of the quartz plate easily, and to suppress warping or a deformation in the electronic component 6 by forming the cover member 601 with the quartz plate. When the electronic device 7 is the image capturing device, it is possible to suppress an a-ray source by forming the cover member 601 with the quartz plate. The insulating member 2 covers the bottom surface of the electronic device 7. That is, the electronic device 7 is not exposed outside the package 1. Therefore, the electronic device 7 has exceptional moisture resistance.

Figure 5A:
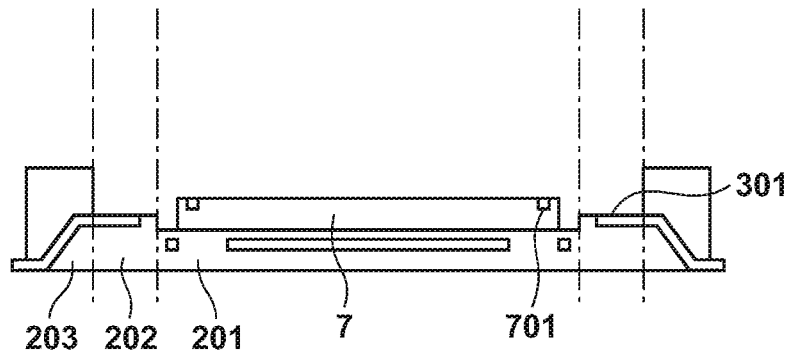
FIGS. 5A to 5C are views for explaining a method of manufacturing the electronic component according to some embodiments.
Figure 5B:
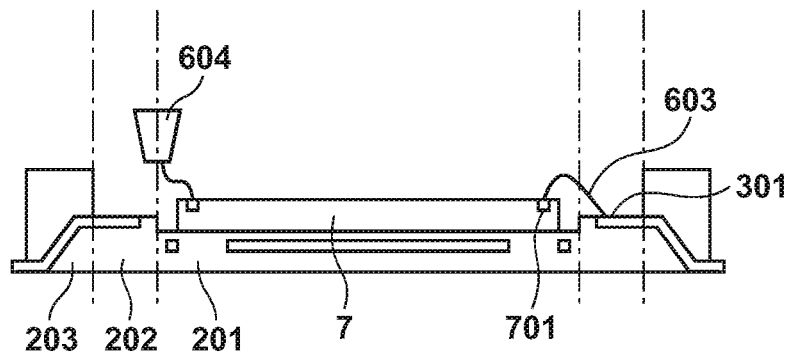
Figure 5C:
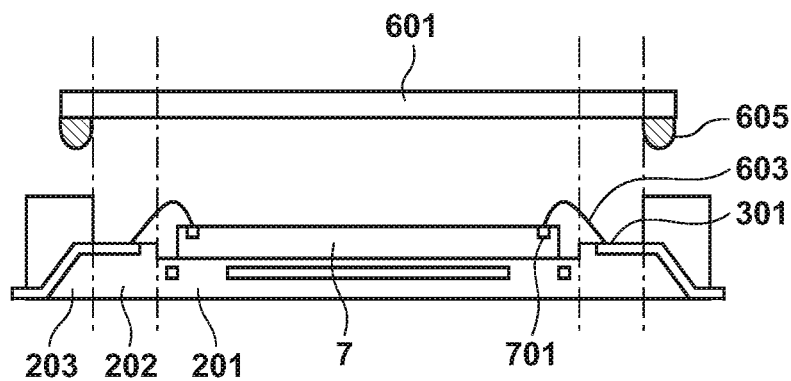

A method of manufacturing the electronic component 6 will now be described with reference to FIGS. 5A to 5C. Each of FIGS. 5A to 5C is a sectional view corresponding to each manufacturing step of FIG. 4B. First, as shown in FIG. 5A, the electronic device 7 is fixed to the upper side of the inner portion 201 of the insulating member 2. This fixing is done by, for example, applying an adhesive (not shown) such as a die bonding paste to the upper surface of the inner portion 201 of the insulating member 2 or the bottom surface of the electronic device 7 and placing the electronic device 7 on the insulating member 2. For example, a printing method or a dispenser method is used to apply the adhesive. A curing process such as thermal curing or UV curing is performed depending on the adhesive to be used.

Next, as shown in FIG. 5B, a bonding apparatus 604 is used to connect the electrodes 701 of the electronic device 7, and the inner terminal portions 301 and 401 of the package 1 by the electrically conductive lines 603. Then, a liquid adhesive 605 is applied along the whole circumference of the cover member 601. Instead of this, the adhesive 605 may be applied to the upper surface of the outer portion 203 of the insulating member 2. For example, the printing method or the dispenser method can be used to apply the adhesive 605. The adhesive 605 is, for example, a photo-curing resin.

Then, the cover member 601 to which the adhesive 605 is applied is placed on the insulating member 2. The liquid adhesive 605 is pressed against the insulating member 2 by the weight or pressing of the cover member 601. Then, the adhesive 605 is cured. The cured adhesive 605 serves as the bonding members 602. The following advantage is obtained by using the photocuring resin as the adhesive 605. The photocuring resin need not be heated for curing, and thus the liquid adhesive 605 is never squeezed out by thermal expansion of an internal space in heating. A thermosetting resin may be used accessorily as post-curing after a photo-curing adhesive is semi-cured by photo-curing. As described above, a manufacturing method of sealing the electronic device 7 not with the resin but with the cover member 601 can also be applied to a case in which the electronic device 7 is a heat-sensitive electronic device, in addition to a case in which the electronic device 7 is the image capturing device or the display device. An example of the heat-sensitive electronic device includes a MEMS device or an electronic device using an organic material.

Figure 6A:
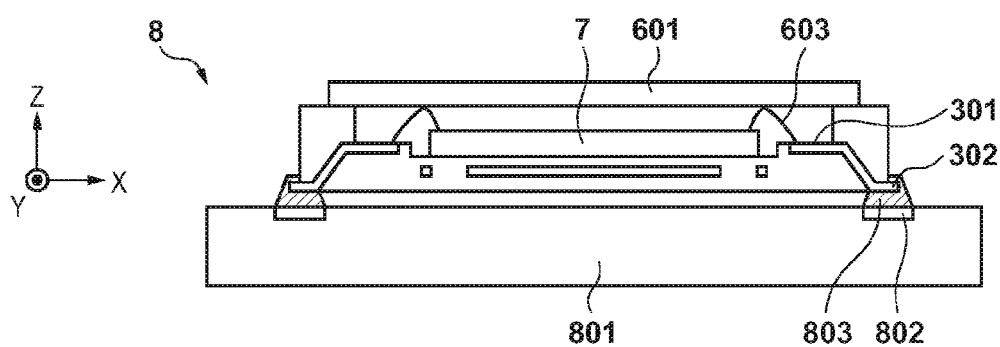
FIGS. 6A and 6B are schematic views for explaining an electronic apparatus according to some embodiments.
Figure 6B:
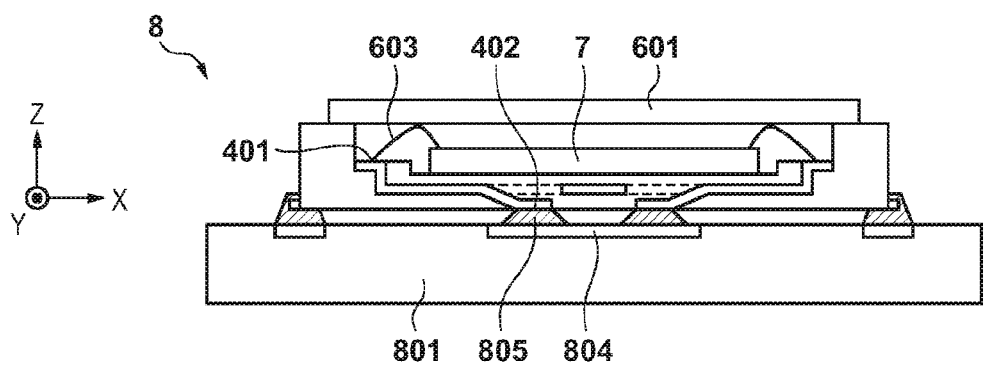
Figure 7A:
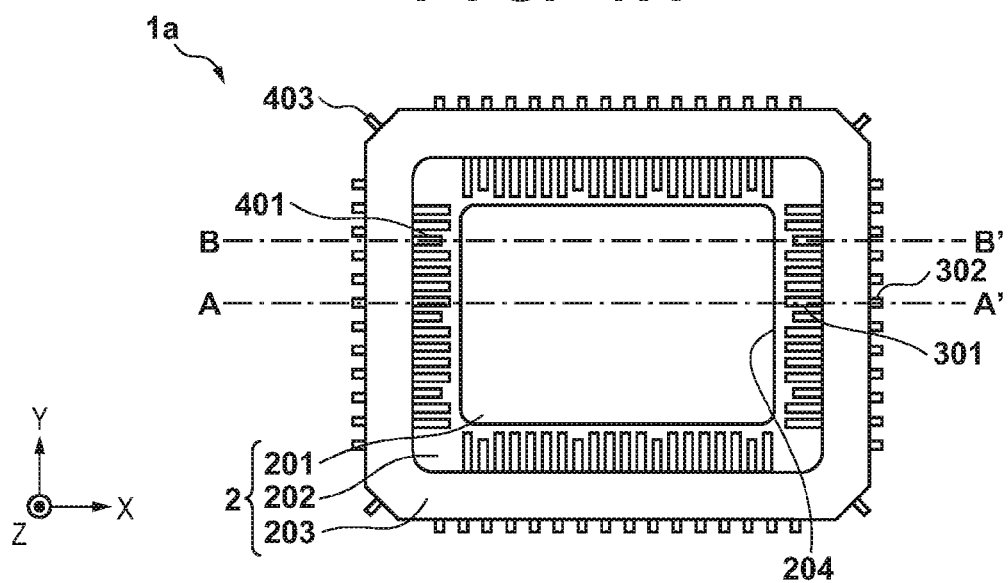
FIGS. 7A to 7D are views for explaining a modification of the package in FIGS. 1A to 1D.
Figure 7B:
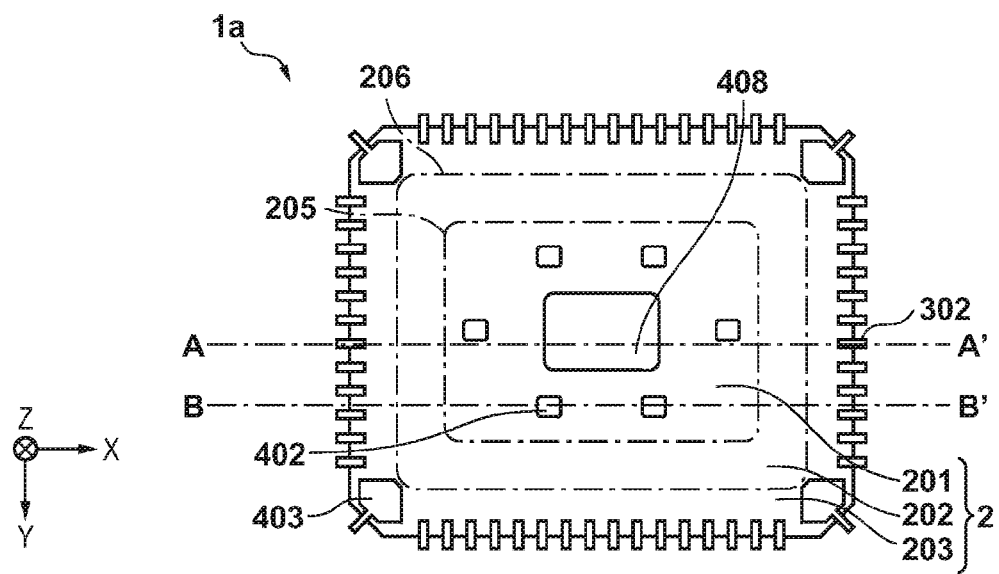
Figure 7C:
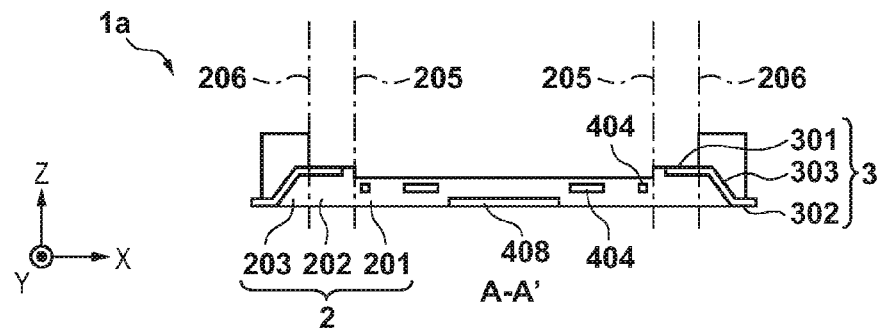
Figure 7D:
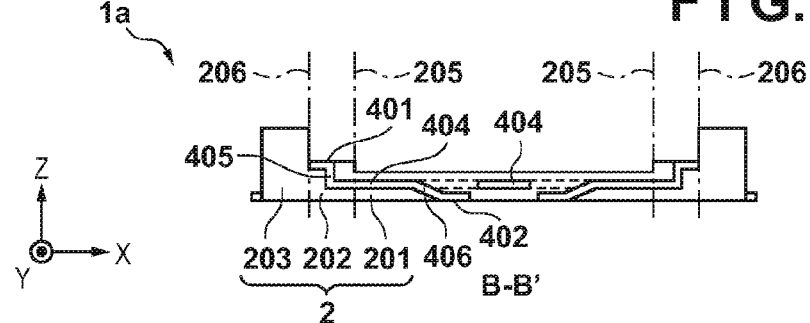
Figure 8:
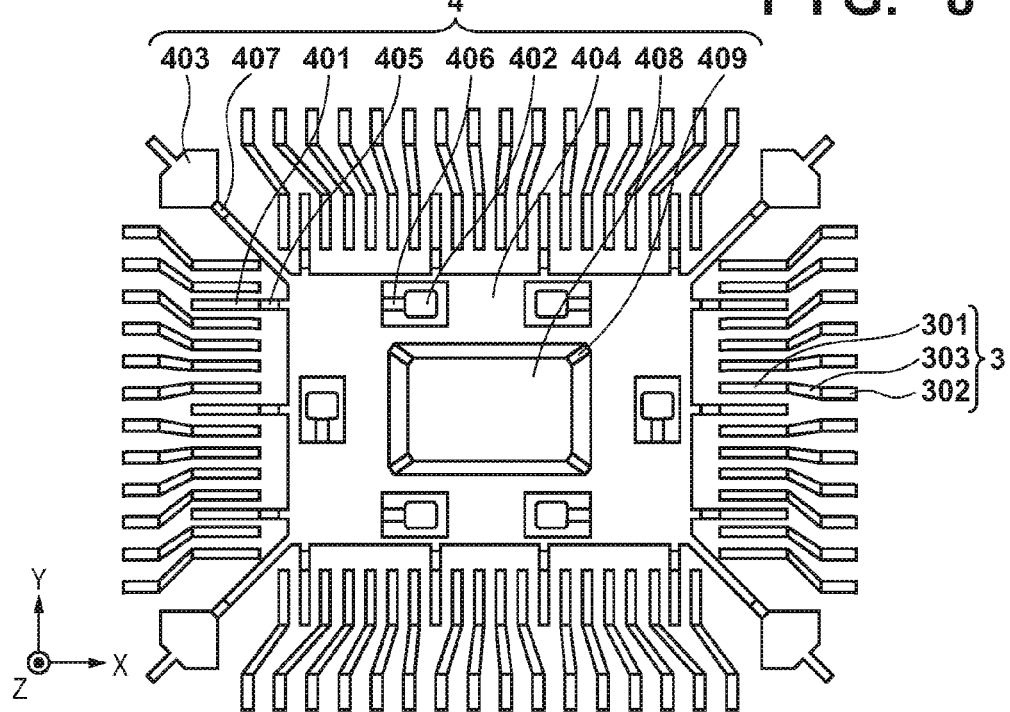
FIG. 8 is a view for explaining the modification of the package in FIGS. 1A to 1D.
Figure 9A:
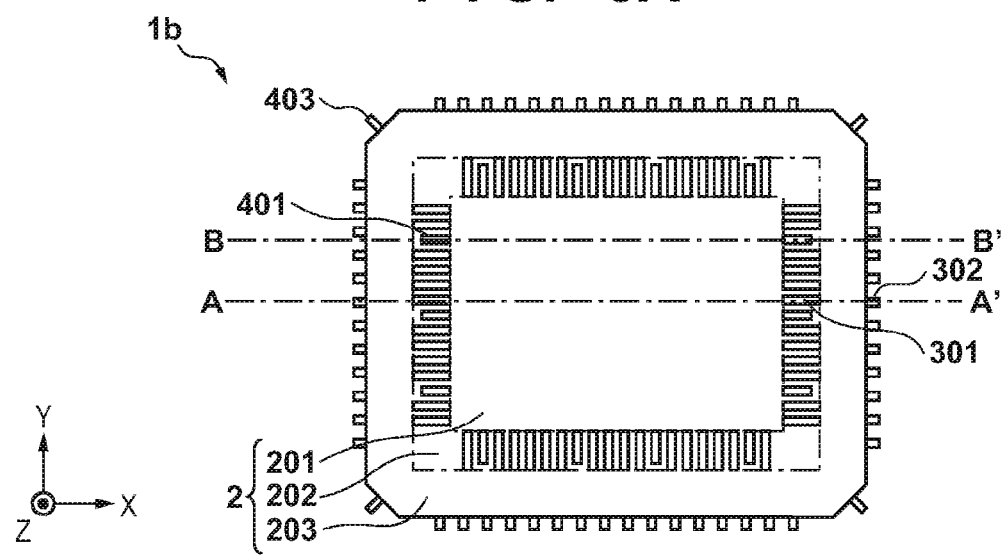
FIGS. 9A to 9D are views for explaining a modification of the package in FIGS. 1A to 1D.
Figure 9B:
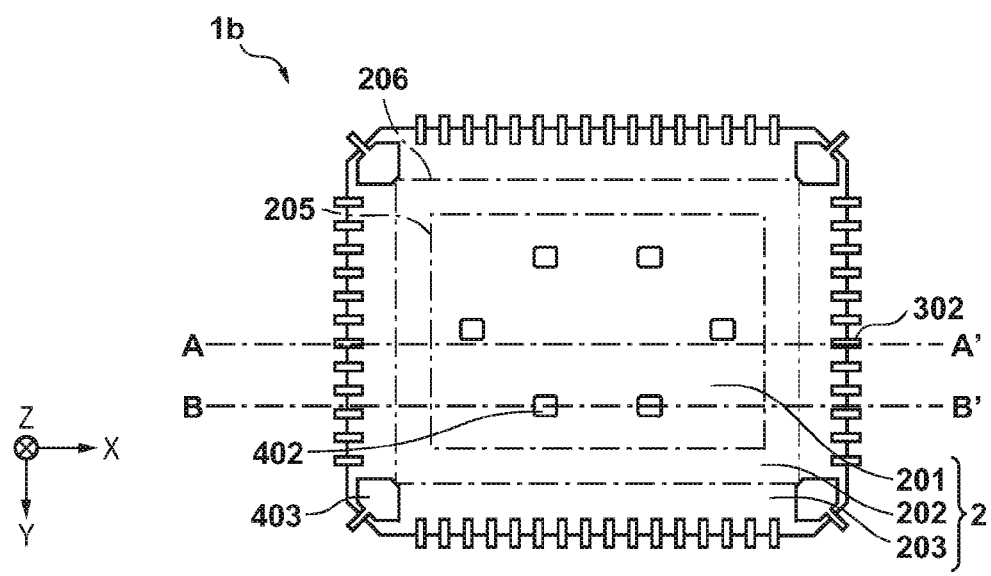
Figure 9C:
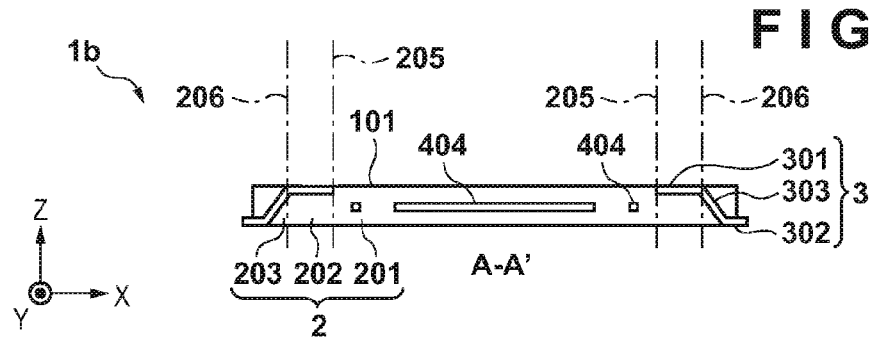
Figure 9D:
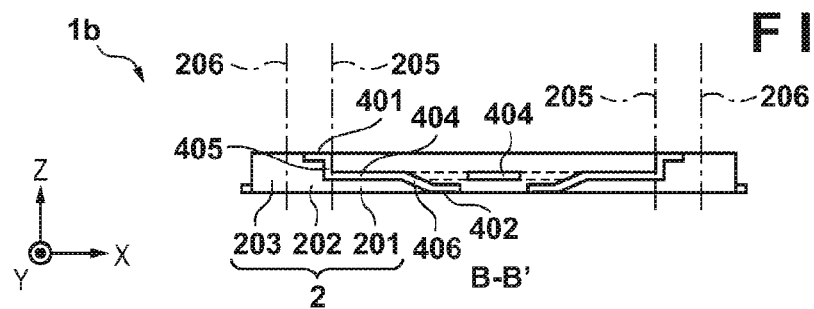

An electronic apparatus 8 including the electronic component 6 will now be described with reference to FIGS. 6A and 6B. In each of FIGS. 6A and 6B, attention is paid to the electronic component 6 of the electronic apparatus 8. FIGS. 6A and 6B are sectional views at positions corresponding to FIGS. 4B and 4C, respectively. The electronic component 6 is connected to a mounting board 801 of the electronic apparatus 8 by soldering. More specifically, the outer terminal portions 302 of the leads 3 are connected to electrodes 802 of the mounting board 801 by soldering members 803, and the outer terminal portions 402 of the electrically conductive member 4 are connected to an electrode 804 of the mounting board 801 by soldering members 805. The soldering members 803 and 805 can be formed at once by solder reflow. The outer terminal portions 402 of the electrically conductive member 4 are connected to the electrode 804 of the mounting board 801 by the soldering members 805. Therefore, heat radiated below the electronic device 7 is efficiently dissipated into the mounting board 801 via the embedded portion 404, the connecting portions 406, the outer terminal portions 402, and the soldering members 805.

Various modifications of the package 1 in FIGS. 1A to 1D will now be described with reference to FIGS. 7A to 10B. Each modification has the same effect as the package 1. Further, in the electronic component 6 and the electronic apparatus 8, the following modifications can also be used in place of the package 1.

First, a package 1a in one modification will be described with reference to FIGS. 7A to 7D and 8. FIGS. 7A to 7D and 8 correspond to FIGS. 1A to 1D and 2, respectively. The package 1a may be different from the package 1 in that the electrically conductive member 4 further includes an exposure portion 408 and connecting portions 409, and may be the same as the package 1 in another aspect. The exposure portion 408 is a portion which forms a part of the bottom surface 102 of the package 1a and is exposed from the second surface of the insulating member 2. In this embodiment, the exposure portion 408 is exposed from the second surface in the inner portion 201 of the insulating member 2. The area of the exposure surface of the exposure portion 408 is larger than that of one outer terminal portion 402. The exposure portion 408 is connected to the embedded portion 404 at its four corners by the connecting portions 409. When the exposure portion 408 is formed by extruding from the lead frame, four connecting portions 409 undergo drawing. The exposure portion 408 is not used for electrical connection with the mounting board, and thus the width of each connecting portion 409 may be smaller than that of each connecting portion 406.

The exposure portion 408 can be used as an identification number printing region for identifying the electronic component 6. For example, the exposure portion 408 has a size capable of laser printing alphanumerics such as a lot number and a two-dimensional barcode. For example, the exposure portion 408 has the size equal to or larger than 5×5 mm. It is possible to suppress the deformation in the electronic component 6 caused by a thermal deformation by arranging the exposure portion 408 in the center of the bottom surface of the insulating member 2. The plurality of outer terminal portions 402 are arranged around the exposure portion 408.

Plating (such as gold plating) for soldering is not performed on the exposure portion 408. This is because if the upper surface of the exposure portion 408 is made of gold, laser printing becomes difficult or solder is adhered, impairing a function as the identification number printing region. Therefore, a surface treatment different from that on each outer terminal portion 402 is performed on the exposure portion 408. As a result, the state of the surface of the exposure portion 408 and that of each outer terminal portion 402 are different from each other. For example, materials, roughnesses, and the like of these surfaces are different from each other. In one example, a structure in which solder is hardly adhered is obtained by performing only Ni plating without performing gold plating on the exposure portion 408 of the electrically conductive member 4 while improving solder wettability by performing gold plating with Ni plating as the underlying layer on the outer terminal portions 402 and 403 of the electrically conductive member 4.

A package 1b in another modification will now be described with reference to FIGS. 9A to 9D. FIGS. 9A to 9D correspond to FIGS. 1A to 1D, respectively. The package 1b may be different from the package 1 in the shape of the insulating member 2 and may be the same as the package 1 in another aspect. The upper surface 101 of the package 1b is flat and does not have a cavity structure.

Also in this modification, as in the package 1, a region where the electronic device is mounted is referred to as the first region, a region where the inner terminal portions 301 of the leads 3 and the inner terminal portions 401 of the electrically conductive member 4 are exposed on the upper side will be referred to as the second region, and a portion which forms the side surfaces will be referred to as the third region. The broken lines 205 indicate the boundary between the first region and the second region. The broken lines 206 indicate the boundary between the second region and the third region. However, the positions of these boundaries are not limited to these.

In the package 1b, the electronic component can be manufactured by sealing the electronic device 7 and the upper surface of the insulating member 2 with a resin after the electronic device 7 is mounted on the front surface of the inner portion 201 of the insulating member 2, and the electrically conductive lines 603 are connected. Instead of this, the periphery of the electronic device 7 may be surrounded by a frame member such as a SUS member, and a cover member may be arranged above the frame member after the electronic device 7 is mounted on the front surface of the inner portion 201 of the insulating member 2, and the electrically conductive lines 603 are connected. Consequently, the electronic component having the hollow structure is manufactured.

Figure 10A:
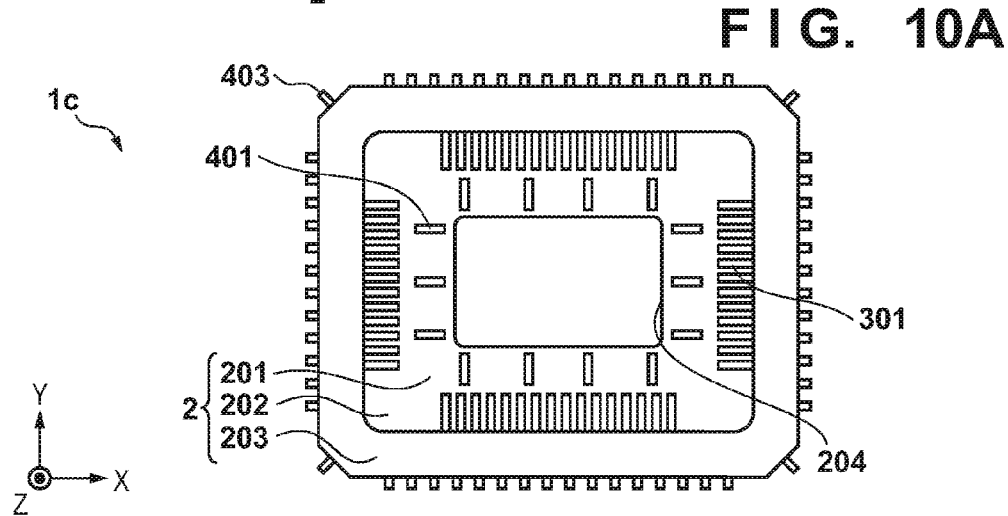
FIGS. 10A and 10B are views for explaining a modification of the package in FIGS. 1A to 1D.

A package 1c in still another modification will now be described with reference to FIG. 10A. FIG. 10A corresponds to FIG. 1A. Other views of the package 1c can be obtained by changing FIGS. 1B to 1D in accordance with FIG. 10A, and thus they are omitted. In the package 1c, the inner terminal portions 301 of the leads 3 are lined up, and the inner terminal portions 401 of the electrically conductive member 4 are also lined up apart from this line. More inner terminal portions 401 can be arranged than in the package 1 though the size becomes larger than that of the package 1.

Figure 10B:
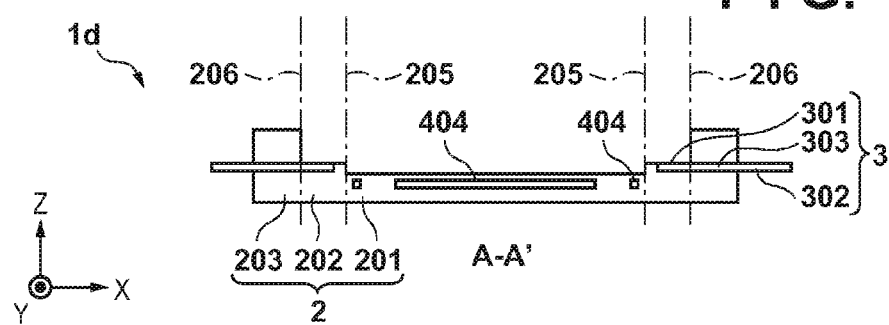

A package 1d in still another modification will now be described with reference to FIG. 10B. FIG. 10B corresponds to FIG. 1C. Other views of the package 1d can be obtained by changing FIGS. 1A, 1B, and 1D in accordance with FIG. 10B, and thus they are omitted. The package 1d is a QFP (Quad Flat Package) package. Each lead 3 penetrates through the insulating member 2 from the corresponding inner terminal portion 301 without changing its height and is exposed from the side surface of the insulating member 2. Each portion, which is each outer terminal portion 302, exposed from the side surface of the insulating member 2 is bent to be connectable to the mounting board (not shown in FIG. 10B). For example, each outer terminal portion 302 is bent into a gull-wing shape. The package 1d can be soldered to the mounting board at once by matching the bottom surface of the outer terminal portions 302, and the bottom surface of each of the outer terminal portions 402 and 403 in height. Portions of the plurality of outer terminal portions 302 soldered to the mounting board may be arrayed in one or two lines.

Second Embodiment

A package 11 for mounting an electronic device will be described as the second embodiment of the present invention with reference to FIGS. 11A to 11D. The package 11 may be different from a package 1 in the shape of an electrically conductive member 4 and may be the same as the package 1 in another aspect. The modifications described above regarding the package 1 can also be applied to the package 11. In the above-described electronic component 6 or electronic apparatus 8, the package 11 can also be used in place of the package 1.

Figure 11A:
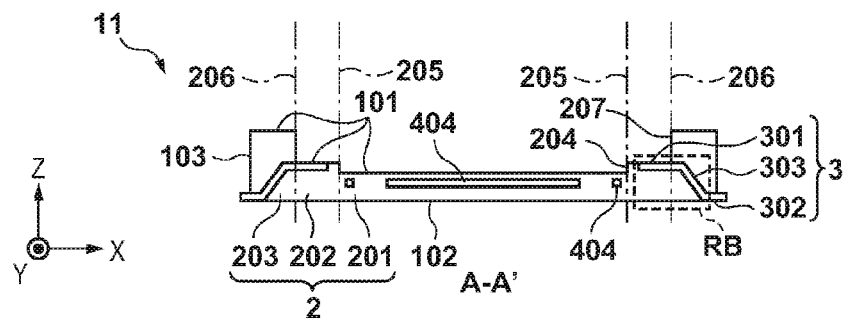
FIGS. 11A to 11D are views for explaining a package according to some embodiments.
Figure 11B:
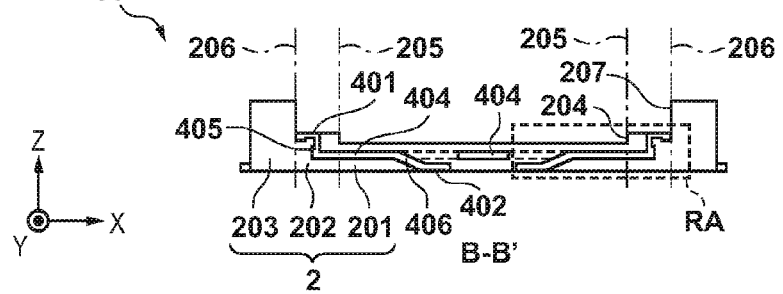

A schematic plan view and a schematic bottom view of the package 11 are the same as those of the package 1 shown in FIGS. 1A and 1B, and thus a description thereof will be omitted. FIGS. 11A and 11B are schematic sectional views taken along the line A-A' and the line B-B' in each of FIGS. 1A and 1B.

Figure 11C:
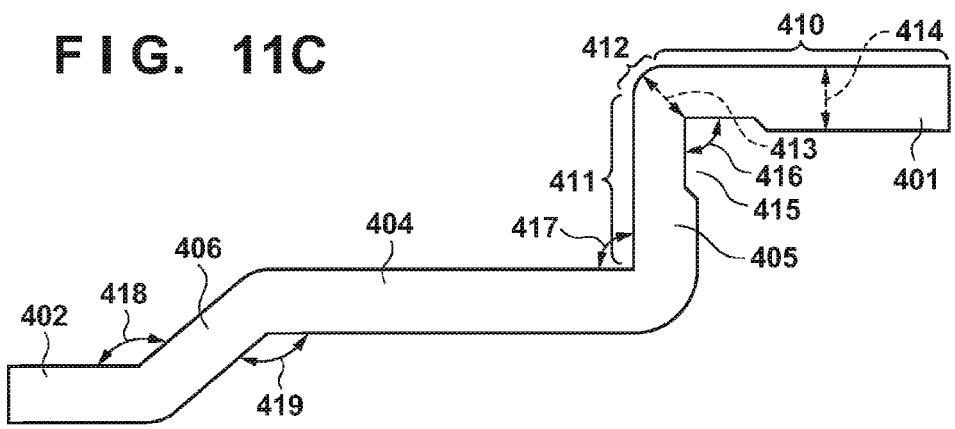

The shape of the electrically conductive member 4 will be described in detail with reference to FIG. 11C. FIG. 11C is an enlarged view in which attention is paid to a portion of a rectangle RA in FIG. 11B of the electrically conductive member 4. As described above, an inner terminal portion 401 is connected to an embedded portion 404 via a connecting portion 405. The upper surface of the inner terminal portion 401 is exposed from an insulating member 2. The inner terminal portion 401 and the connecting portion 405 include, on their upper surface, a plane surface 411, a curved surface 412, and a plane surface 410 in order closer to the embedded portion 404. A bonding wire for connection with the electronic device is connected to the plane surface 411. Therefore, the plane surface 411 needs a size to some extent. However, the size of the curved surface 412 may be small because it is difficult to perform bonding on the curved surface 412. The size of the package 1 in the horizontal direction can be reduced as the size of the curved surface 412 is smaller. Accordingly, in this embodiment, a thickness 413 of a portion forming the curved surface 412 is reduced by forming a dent 415 on the side opposite to the curved surface 412 of the electrically conductive member 4. The thickness 413 of the portion forming the curved surface 412 is, for example, the minimum value of the thickness of the electrically conductive member 4 measured in a normal direction from a point on the curved surface 412. As a result, the curvature radius of the curved surface 412 becomes smaller, and thus the size of the curved surface 412 becomes smaller than in a case in which the dent 415 is not formed. In particular, the size of the curved surface 412 tends to be larger as an angle 416 formed by the inner terminal portion 401 and the connecting portion 405 is smaller, making formation of the dent 415 effective.

The thickness 413 of the portion forming the curved surface 412 is smaller than a thickness 414 (for example, the thickness of the inner terminal portion 401) of a portion where the dent 415 is not formed. If the thickness 413 is too small, the electrically conductive member 4 is easily cut in the portion forming the curved surface 412. If the thickness 413 is too large, an effect brought about by the dent 415 is poor. Therefore, the thickness 413 may fall within a range of, for example, 10% (inclusive) to 75% (inclusive) of the thickness 414. Further, the thickness 413 may fall within a range of 25% (inclusive) to 60% (inclusive) of the thickness 414. More specifically, the thickness 413 may fall within a range of 0.10 mm to 0.16 mm, and the thickness 414 may be about 0.25 mm.

Figure 11D:
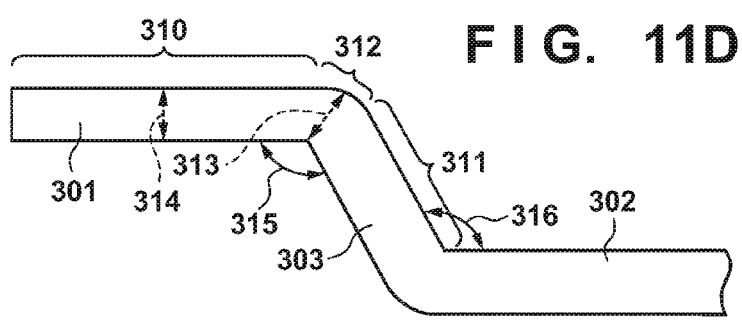

The shape of a lead 3 will be described in detail with reference to FIG. 11D. FIG. 11D is an enlarged view in which attention is paid to a portion of a rectangle RB in FIG. 11A of the lead 3. As described above, an inner terminal portion 301 and an outer terminal portion 302 are connected to each other via a connecting portion 303. The upper surface of the inner terminal portion 301 is exposed from the insulating member 2. The inner terminal portion 301 and the connecting portion 303 include, on their upper surface, a plane surface 311, a curved surface 312, and a plane surface 310 in order closer to the outer terminal portion 302. The curved surface 312 is embedded in an outer portion 203 of the insulating member 2. The outer portion 203 has a width to some extent, and thus a reduction in the size of the curved surface 312 does not contribute to a reduction in the size of the package 1 in the horizontal direction. Therefore, no dent may be formed on the side opposite to the curved surface 312 of the lead 3. For example, a thickness 313 of a portion forming the curved surface 312 may be the same as a thickness 314 (for example, the thickness of the inner terminal portion 301) of a portion forming the plane surface. In consideration of a deformation caused by bending as well, the thickness 313 may fall within a range of, for example, 90% (inclusive) to 110% (inclusive) of the thickness 314. In another embodiment, a dent may be formed on the side opposite to the curved surface 312 of the lead 3.

A method of manufacturing the package 11 will now be described. In the method of manufacturing the package 11, the inner terminal portion 401 and the connecting portion 405 shown in FIG. 11C are formed in the bending step of the method of manufacturing the package 1 described above, as will be described below with reference to FIGS. 12A to 12C. In each of FIGS. 12A to 12C, attention is paid to a portion, of a lead frame 5, for forming the inner terminal portion 401 and the connecting portion 405. An upper surface 504 of the lead frame 5 is a surface to be on the upper side in the package 1. A bottom surface 505 of the lead frame 5 is a surface to be on the lower side in the package 1.

As shown in FIG. 12A, the lead frame 5 is sandwiched between an upper die 9a and a lower die 9b. In this step, the lead frame 5 is just bent preliminarily. Therefore, an angle 901 of the concave portion of the upper die 9a may be larger than the angle 416 formed by the inner terminal portion 401 and the connecting portion 405. Next, as shown in FIG. 12B, the lead frame 5 is sandwiched between an upper die 9c and a lower die 9d. An angle 902 of the concave portion of the upper die 9c may be the same as the angle 416 formed by the inner terminal portion 401 and the connecting portion 405. The lower die 9d has a projection 903. The projection 903 is pressed against the lead frame 5 on the side of the bottom surface 505, forming the dent 415 of FIG. 11C.

Next, as shown in FIG. 12C, the lead frame 5 is sandwiched between an upper die 9e and a lower die 9f. An angle 904 of the concave portion of the upper die 9e is the same as the angle 416 formed by the inner terminal portion 401 and the connecting portion 405. An angle 905 of the concave portion of the lower die 9f is the same as an angle 417 formed by the embedded portion 404 and the connecting portion 405. Therefore, the lead frame 5 is formed into a shape used in the package 1 after the step of FIG. 12C.

In the above-described example, a part of the bending step of the lead frame 5 and the step of forming the dent 415 are performed at once. Instead of this, the step of forming the dent 415 may be performed after completion of the bending step, or the bending step may be performed after the step of forming the dent 415.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2015-228091 and 2015-228090, filed Nov. 20, 2015, which are hereby incorporated by reference herein in their entirety.

What is claimed is:

1. A package including a first surface on which an electronic device is to be mounted, a second surface on a side opposite to the first surface, and a side surface that connects the first surface and the second surface, the package comprising:
   an insulating member that forms a part of the first surface, a part of the second surface and a part of the side surface;
   a plurality of first electrically conductive members; and
   a second electrically conductive member,
   wherein each of the plurality of first electrically conductive members includes
   a first terminal portion that forms a part of the first surface and is to be connected with a bonding wire, and
   a second terminal portion that is positioned on a side of the side surface with respect to the first terminal portion and forms a part of the side surface,
   wherein the second electrically conductive member includes
   an embedded portion embedded in the insulating member,
   a plurality of third terminal portions each of which forms a part of the first surface, is to be connected to the bonding wire and is connected to the embedded portion, and
   a fourth terminal portion that forms a part of the second surface and is connected to the embedded portion, and
   wherein at least one of the third terminal portions is positioned between two of the first terminal portions in a direction along the side surface.

2. The package according to claim 1, wherein the insulating member includes an inner portion including a portion for supporting the electronic device, an outer portion that forms the part of the side surface, and an intermediate portion between the inner portion and the outer portion,
   the first terminal portion and the plurality of third terminal portions form a part of the first surface in the intermediate portion of the insulating member, and
   the fourth terminal portion forms a part of the second surface in the inner portion of the insulating member.

3. The package according to claim 2, wherein the second electrically conductive member further includes a fifth terminal portion connected to the embedded portion and configured to form a part of the second surface in the outer portion of the insulating member, and
   on the second surface, an area of the fifth terminal portion is larger than an area of one of the second terminal portions.

4. The package according to claim 1, wherein the part of the first surface formed by the first terminal portion and the part of the first surface formed by each of the plurality of third terminal portions are not covered with the insulating member.

5. The package according to claim 1, wherein the number of the plurality of third terminal portions each of which forms the part of the first surface is larger than the number of fourth terminal portions each of which forms the part of the second surface.

6. A package including a first surface on which an electronic device is to be mounted, a second surface on a side opposite to the first surface, and a side surface that connects the first surface and the second surface, the package comprising:

an insulating member that forms a part of the first surface, a part of the second surface and a part of the side surface;

a plurality of first electrically conductive members; and a second electrically conductive member, wherein each of the plurality of first electrically conductive members includes a first terminal portion that forms a part of the first surface, and a second terminal portion that is positioned on a side of the side surface with respect to the first terminal portion and forms a part of the side surface, wherein the second electrically conductive member includes an embedded portion embedded in the insulating member, a plurality of third terminal portions each of which forms a part of the first surface and is connected to the embedded portion, and a fourth terminal portion that forms a part of the second surface and is connected to the embedded portion, wherein a third terminal portion is positioned between the first terminal portion and another terminal portion in a direction in which a plurality of terminal portions including the first terminal portion and the plurality of third terminal portions are arrayed, and wherein the second electrically conductive member further includes an exposure portion exposed from the second surface, and a state of a surface of the exposure portion is different from that of the fourth terminal portion.

7. The package according to claim 1, wherein the insulating member is made of a resin.

8. The package according to claim 1, wherein the package is of a QFN type.

9. An electronic component comprising:

the package according to claim 1;

an electronic device supported on the first surface of the package, and including a plurality of electrodes including a first electrode and a second electrode;

a first electrically conductive line that connects the first electrode and the first terminal portion of one of the plurality of first electrically conductive members; and a second electrically conductive line that connects the second electrode and one of the plurality of third terminal portions of the second electrically conductive member.

10. The component according to claim 9, wherein the electronic device comprises one of an image capturing device and a display device.

11. The component according to claim 9, wherein the first electrode is an electrode for supplying a signal, and the second electrode is an electrode for supplying a ground potential.

12. An electronic device comprising:

the package according to claim 1;

an electronic device supported on the first surface of the package, and including a plurality of electrodes including a first electrode and a second electrode;

a first electrically conductive line that connects the first electrode and the first terminal portion of one of the plurality of first electrically conductive members;

a second electrically conductive line that connects the second electrode and one of the plurality of third terminal portions of the second electrically conductive member; and a mounting board, wherein each of the second terminal portion and the fourth terminal portion of the package are soldered to the mounting board.

13. A package including a first surface on which an electronic device is to be mounted, a second surface on a side opposite to the first surface, and a side surface that connects the first surface and the second surface, the package comprising:

an insulating member that forms a part of the first surface, a part of the second surface and a part of the side surface;

a first electrically conductive member; and a second electrically conductive member, wherein the first electrically conductive member includes a first terminal portion that forms a part of the first surface, a second terminal portion that is positioned on a side of the side surface with respect to the first terminal portion and forms a part of the side surface, and a first connecting portion that connects the second terminal portion and an end of the first terminal portion on the side of the side surface, and is embedded in the insulating member, and wherein the second electrically conductive member includes a third terminal portion that forms a part of the first surface, an embedded portion embedded in the insulating member, positioned on a side opposite to the side surface with respect to the third terminal portion, and extending along the second surface, and a second connecting portion that connects the embedded portion and an end of the third terminal portion on the side opposite to the side surface, and is embedded in the insulating member, and wherein an angle formed by the third terminal portion and the second connecting portion on a side of the second surface is smaller than an angle formed by the first terminal portion and the first connecting portion on the side of the second surface.

14. The package according to claim 13, wherein the angle formed by the third terminal portion and the second connecting portion falls within a range of 30° (inclusive) to 100° (inclusive).

15. A package including a first surface on which an electronic device is to be mounted, a second surface on a side opposite to the first surface, and a side surface that connects the first surface and the second surface, the package comprising:

an insulating member that forms a part of the first surface, a part of the second surface and a part of the side surface;

a first electrically conductive member; and a second electrically conductive member, wherein the first electrically conductive member includes a first terminal portion that forms a part of the first surface, a second terminal portion that is positioned on a side of the side surface with respect to the first terminal portion and forms a part of the side surface, and a first connecting portion that connects the second terminal portion and an end on the side of the side surface of the first terminal portion, and is embedded in the insulating member, and wherein the second electrically conductive member includes a third terminal portion that forms a part of the first surface, a fourth terminal portion that forms a part of the second surface, an embedded portion embedded in the insulating member, positioned on a side opposite to the side surface with respect to the third terminal portion, and extending along the second surface, a second connecting portion configured to connect the embedded portion and an end on the side opposite to the side surface of the third terminal portion, and is embedded in the insulating member, and a third connecting portion configured to connect the fourth terminal portion and the embedded portion, and embedded in the insulating member, wherein the second electrically conductive member has a curved surface on a side of the first surface from the third terminal portion to the second connecting portion, wherein a dent is formed on a side opposite to the curved surface of the second electrically conductive member, wherein a thickness of a portion that forms the curved surface of the second electrically conductive member is smaller than a thickness of the third terminal portion, and wherein an angle formed by the fourth terminal portion and the third connecting portion on the side of the first surface is larger than an angle formed by the third terminal portion and the second connecting portion on a side of the second surface.

16. The package according to claim 15, wherein the thickness of the portion that forms the curved surface of the second electrically conductive member falls within a range of 10% (inclusive) to 75% (inclusive) of the thickness of the third terminal portion.

17. The package according to claim 15, wherein the package includes a third electrically conductive member adjacent to the first terminal portion and the second terminal portion, and a distance between the second terminal portion and the third electrically conductive member is larger than a distance between the third electrically conductive member and the first terminal portion.

18. An electronic component comprising:

the package according to claim 15;

an electronic device supported on the first surface of the package, and including a plurality of electrodes including a first electrode and a second electrode;

a first electrically conductive line that connects the first electrode and the first terminal portion of the package; and a second electrically conductive line that connects the second electrode and the third terminal portion of the package.

19. An electronic apparatus comprising:

the package according to claim 15;

an electronic device supported on the first surface of the package, and including a plurality of electrodes including a first electrode and a second electrode;

a first electrically conductive line that connects the first electrode and the first terminal portion of the package;

a second electrically conductive line that connects the second electrode and the third terminal portion of the package; and a mounting board, wherein the second terminal portion of the package is soldered to the mounting board.

20. The package according to claim 6, wherein gold plating is performed on the fourth terminal portion and is not performed on the exposure portion.

* * * * *